United States Patent
Rinzler et al.

(10) Patent No.: US 9,601,707 B2
(45) Date of Patent: Mar. 21, 2017

(54) AMBIPOLAR VERTICAL FIELD EFFECT TRANSISTOR

(71) Applicant: University of Florida Research Foundation, Inc., Gainesville, FL (US)

(72) Inventors: Andrew Gabriel Rinzler, Newberry, FL (US); Bo Liu, Gainesville, FL (US); Mitchell Austin McCarthy, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 14/648,608

(22) PCT Filed: Nov. 26, 2013

(86) PCT No.: PCT/US2013/071919
§ 371 (c)(1),
(2) Date: May 29, 2015

(87) PCT Pub. No.: WO2014/085410
PCT Pub. Date: Jun. 5, 2014

(65) Prior Publication Data
US 2015/0340631 A1    Nov. 26, 2015

Related U.S. Application Data

(60) Provisional application No. 61/731,750, filed on Nov. 30, 2012.

(51) Int. Cl.
*H01L 51/05* (2006.01)
*H01L 27/28* (2006.01)
(Continued)

(52) U.S. Cl.
CPC ............ *H01L 51/057* (2013.01); *B82Y 10/00* (2013.01); *H01L 27/092* (2013.01);
(Continued)

(58) Field of Classification Search
CPC ............... H01L 27/088; H01L 29/1079; H01L 29/7455; H01L 29/0847; H01L 51/057;
(Continued)

(56) References Cited

U.S. PATENT DOCUMENTS

| 5,429,968 A | * | 7/1995 | Koyama | ................. G11C 11/56 257/E27.026 |
|---|---|---|---|---|
| 2002/0070382 A1 | * | 6/2002 | Yamazaki | ........... G02F 1/13454 257/72 |

(Continued)

FOREIGN PATENT DOCUMENTS

| JP | 2003-332350 A | 11/2003 |
|---|---|---|
| WO | WO 2007/048041 A2 | 4/2007 |

(Continued)

OTHER PUBLICATIONS

International Search Report mailed Mar. 19, 2014 in connection with Application No. PCT/US2013/071919.

(Continued)

*Primary Examiner* — Jarrett Stark
*Assistant Examiner* — Shahed Ahmed
(74) *Attorney, Agent, or Firm* — Wolf, Greenfield & Sacks, P.C.

(57) ABSTRACT

Various examples are provided for ambipolar vertical field effect transistors (VFETs). In one example, among others, an ambipolar VFET includes a gate layer; a source layer that is electrically percolating and perforated; a dielectric layer; a drain layer; and a semiconducting channel layer. The semiconducting channel layer is in contact with at least a portion of the source layer and at least a portion of the dielectric layer and the source layer and the semiconducting channel layer form a gate voltage tunable charge injection barrier. Another example includes an ambipolar vertical field effect transistor including a dielectric surface treatment layer. The (Continued)

semiconducting channel layer is in contact with at least a portion of the source layer and at least a portion of the dielectric surface treatment layer and where the source layer and the semiconducting channel layer form a gate voltage tunable charge injection barrier.

25 Claims, 13 Drawing Sheets

(51) Int. Cl.
    *H01L 51/10*     (2006.01)
    *H01L 29/739*     (2006.01)
    *B82Y 10/00*     (2011.01)
    *H01L 29/16*     (2006.01)
    *H01L 29/41*     (2006.01)
    *H01L 27/092*     (2006.01)
    *H01L 51/00*     (2006.01)
    *H01L 29/775*     (2006.01)
    *H01L 29/06*     (2006.01)

(52) U.S. Cl.
    CPC ........ H01L 27/283 (2013.01); H01L 29/1606 (2013.01); H01L 29/413 (2013.01); H01L 29/7395 (2013.01); H01L 51/0566 (2013.01); H01L 51/102 (2013.01); *H01L 29/0673* (2013.01); *H01L 29/775* (2013.01); *H01L 51/0039* (2013.01); *H01L 51/0047* (2013.01); *H01L 51/0048* (2013.01); *H01L 51/105* (2013.01)

(58) Field of Classification Search
    CPC ......... H01L 51/444; H01L 2924/13061; H01L 27/092; H01L 27/283; H01L 29/1606; H01L 29/413; H01L 29/7395; H01L 51/056; H01L 51/102; H01L 29/0673; H01L 29/775; H01L 51/0039; H01L 51/0047; H01L 51/0048

USPC ......... 257/288, 368, 369; 438/151, 197, 199
See application file for complete search history.

(56) References Cited

U.S. PATENT DOCUMENTS

| | | | |
|---|---|---|---|
| 2007/0147159 A1* | 6/2007 | Lee | G11C 5/148 365/227 |
| 2008/0143389 A1 | 6/2008 | Keshavarzi et al. | |
| 2009/0008634 A1 | 1/2009 | Tessler et al. | |
| 2009/0085182 A1* | 4/2009 | Yamazaki | H01L 23/295 257/679 |
| 2009/0159971 A1* | 6/2009 | Street | H01L 29/4908 257/347 |
| 2009/0206341 A1* | 8/2009 | Marks | H01L 21/02554 257/66 |
| 2010/0127243 A1 | 5/2010 | Banerjee et al. | |
| 2010/0237336 A1* | 9/2010 | Rinzler | B82Y 10/00 257/40 |
| 2011/0248243 A1 | 10/2011 | Chen et al. | |
| 2012/0012919 A1* | 1/2012 | Kan | B82Y 10/00 257/316 |
| 2012/0101022 A1* | 4/2012 | Tovar | A61K 49/0056 514/1.1 |
| 2013/0258782 A1* | 10/2013 | Tatsumura | G11C 16/06 365/185.17 |

FOREIGN PATENT DOCUMENTS

WO     WO 2011/109693 A2     9/2011
WO     WO 2012/078759 A2     6/2012

OTHER PUBLICATIONS

Extended European Search Report mailed Sep. 12, 2016 for Application No. EP 13857789.5.

* cited by examiner

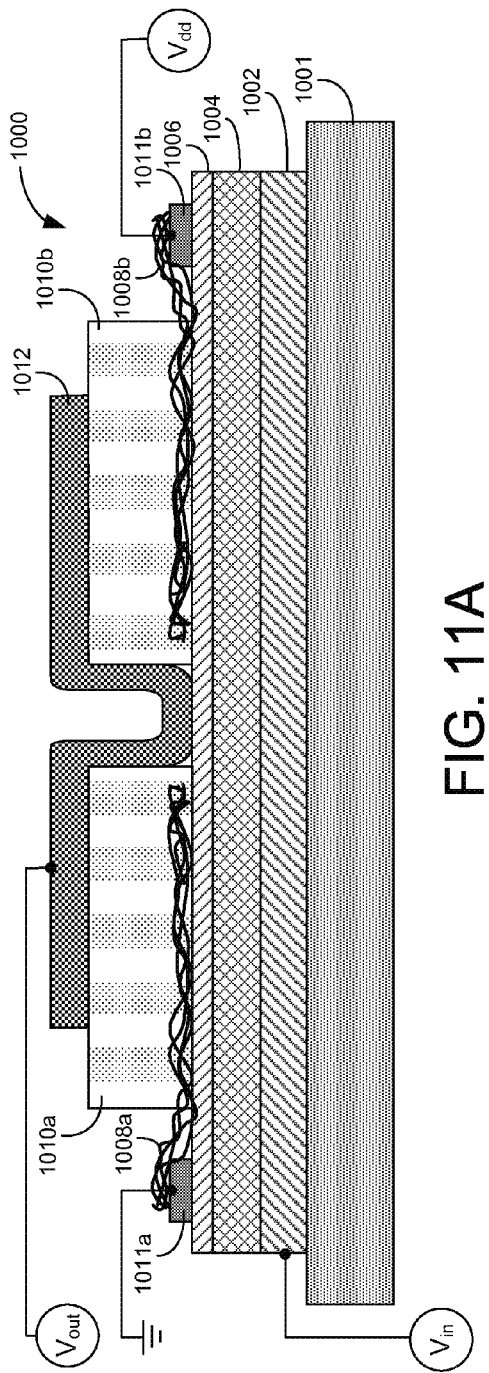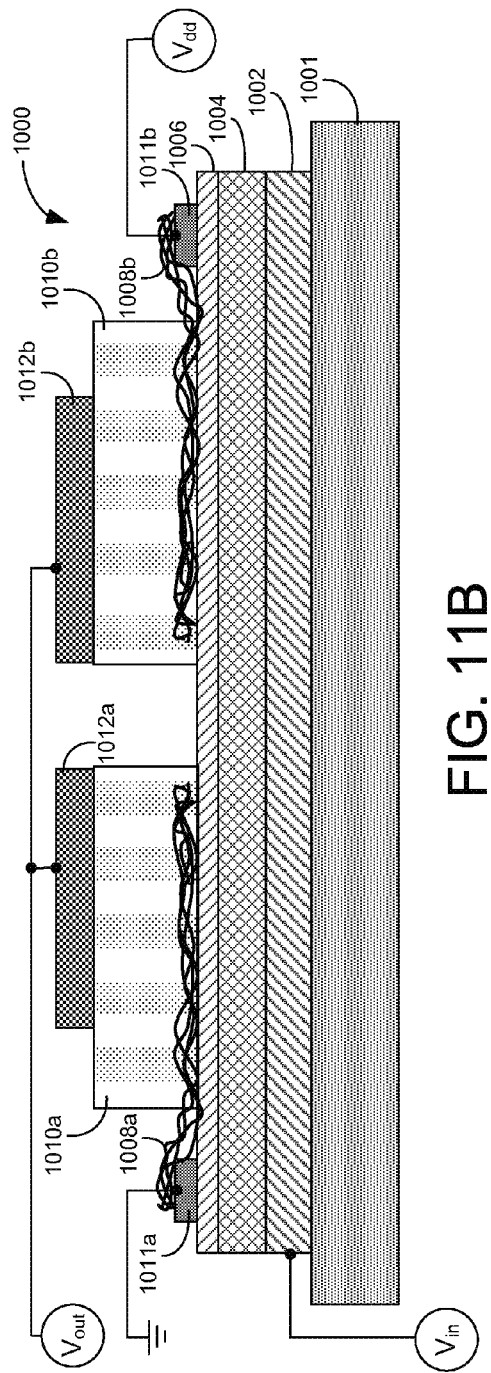
FIG. 11A
FIG. 11B

AMBIPOLAR VERTICAL FIELD EFFECT TRANSISTOR

CROSS-REFERENCE TO RELATED APPLICATIONS

This application is a U.S. National Stage application under 35 U.S.C. §371 based on International Application No. PCT/US2013/071919, entitled "AMBIPOLAR VERTICAL FIELD EFFECT TRANSISTOR" filed Nov. 26, 2013, which claims priority to and the benefit of U.S. provisional application entitled "AMBIPOLAR VERTICAL FIELD EFFECT TRANSISTOR" having Ser. No. 61/731,750, filed Nov. 30, 2012, each of which is hereby incorporated by reference herein in its entirety.

BACKGROUND

By virtue of low static power consumption, high noise immunity and robustness, complementary transistor technology is the mainstream technology for silicon based integrated circuits (ICs). Organic electronics has been much researched in recent decades and developed to the point where the integration of organic component based ICs for simple applications can begin to be contemplated.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 10, 11A, and 11B are graphical representations of examples of digital inverters including ambipolar CN-VFETs in accordance with various embodiments of the present disclosure.

DETAILED DESCRIPTION

Figure 1:
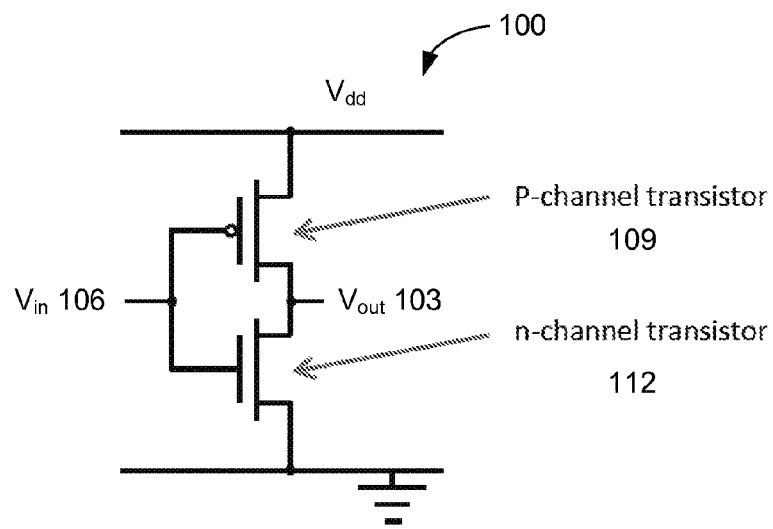
FIG. 1 is a schematic diagram of an inverter circuit in accordance with various embodiments of the present disclosure.

Disclosed herein are various embodiments related to ambipolar vertical field effect transistors (VFETs) such as ambipolar carbon nanotube enabled VFETs. Reference will now be made in detail to the description of the embodiments as illustrated in the drawings, wherein like reference numbers indicate like parts throughout the several views.

In a complementary circuit, both p-channel and n-channel transistors are used. However, unlike silicon based ICs which achieve p- and n-channel transistors in a single semiconductor (e.g., silicon) by simple implementation of the proper contact and channel dopants, dedicated semiconductor materials are needed for p-channel and n-channel organic thin film transistors (OTFTs). The integration of discrete n-channel and p-channel organic transistors in ICs of a reasonable scale remains challenging. Patterning of organics to achieve separately defined p- and n-channel active regions adds substantial complexity to the device fabrication. This may be avoided by using ambipolar organic transistors, which benefit from having a channel that can be deposited in a single masking step.

Controlled by the gate voltage, the p-channel and n-channel active regions can both be formed in an ambipolar organic transistor. A complementary circuit may then be fabricated using solely ambipolar organic transistors, thereby greatly reducing the fabrication complexity. The effective injection of both electrons and holes from the same metal electrode of an ambipolar OTFT may be accomplished using a low bandgap organic semiconductor where the highest occupied molecular orbital (HOMO) and lowest unoccupied molecular orbital (LUMO) levels are within about 0.8 eV of the work function of the metal. In alternative implementations, effective injection of both electrons and holes (from the same metal) may be achieved by combining two organic semiconductors, which do not necessarily have a low bandgap. By judicious material selection, the HOMO level of one, and the LUMO level of the other can be arranged to lie within about 0.8 eV of the work function of the metal.

The two materials can be combined to form the channel layer in a variety of ways. For example, the two distinct organic semiconductors may be separately deposited as a bi-layer (one on-top of the other). In practice, this may be implemented with evaporable small molecule organic semiconductors by separate, sequential, vapor depositions, and has resulted in devices operating with good performance. However, solution based processing is desired for organic electronic devices to benefit from low-cost manufacturing approaches like ink-jet printing and roll-to-roll fabrication. Polymers and some small molecules or modified small molecules can be solution processed, but the deposition of bi-layers is complicated by the need for orthogonal solvents (i.e., the solvent in the second layer should not dissolve the first) which greatly restricts the materials that may be used. In another example, the two organic semiconductors may be combined by blending them together in the same solvent. The blend may then be deposited as a single channel layer.

While gate controlled ambipolar transport may be observed when such organic semiconductor blends are used as the transistor channel material, the best semiconductor blend devices exhibited mobilities that were two to three orders of magnitude lower than devices made with either pure p-type or n-type semiconducting channel materials. For example, ambipolar polymer blend transistors with poly{[N,N0-bis(2-octyldodecyl)-naphthalene-1,4,5,8-bis(dicarboximide)-2,6-diy]-alt-5,50-(2,20-bithiophene)} (P(NDI2OD-T2)) as the n-type material and regioregular poly(3-hexylthiophene) (rr-P3HT) as the p-type material were demonstrated by K. Szendrei et al. in 2010 (*J Mater Chem*, Vol 20, 1317-1321 (2010)). The device achieved mobilities of $4\times10^{-3}$ cm$^2$V$^{-1}$s$^{-1}$ for electrons and $2\times10^{-3}$ cm$^2$V$^{-1}$s$^{-1}$ for holes, which are the highest reported to date for polymer blend transistors. However, this remains very low when compared with the mobility in a pure P(NDI2OD-T2) device of 0.45 cm$^2$V$^{-1}$s$^{-1}$ and that of a pure rr-P3HT's device mobility of 0.1 cm$^2$V$^{-1}$s$^{-1}$. The reason for the low mobilities observed in the blended material devices is the absence of percolating pure domains of the p- and n-type materials across the 10-100 µm distant source-drain electrodes in the conventional lateral channel transistor configuration. Extending percolating pathways of pure p-type or n-type all the way through the channel layer from one electrode to the other electrode, the device performance can be improved to a level much closer to that of single material devices.

Referring to FIG. 1, shown is an example of a CMOS inverter circuit 100. The inverter circuit 100 outputs a voltage 103 that is the opposite logic-level of its input voltage 106. Thus, an input voltage 106 at V$_{dd}$ returns an output voltage 103 at the ground level and an input voltage 106 at ground returns an output voltage 103 at V$_{dd}$. The digital inverter such as the example of FIG. 1 is the basis for all digital electronics. The traditional CMOS inverter 100 depicted in FIG. 1 does not suffer from leakage current because of the unipolar properties of each transistor 109 and 112. With V$_{dd}$ applied as the input voltage 106 of the CMOS inverter 100, the p-channel transistor 109 turns on and the n-channel transistor 112 turns off, resulting in an output voltage 103 at the ground level. When the input voltage 106 is grounded, the n-channel transistor 112 turns on and the p-channel transistor 109 turns off, resulting in an output voltage 103 of V$_{dd}$. In both logic states, one of the transistors 109/112 is off, thereby preventing current flow through the CMOS inverter 100 in the steady state.

Figure 2A:
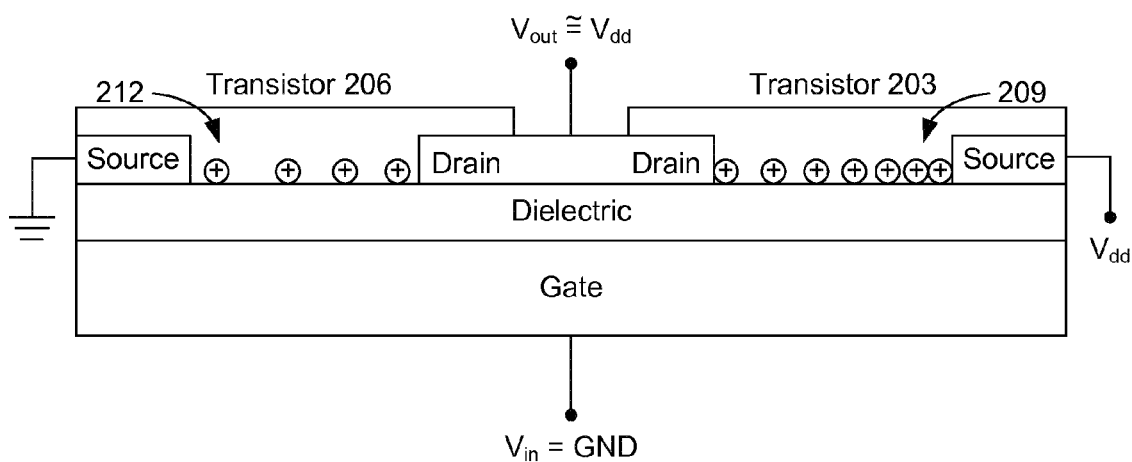
FIGS. 2A and 2B are graphical representations of an example of an ambipolar lateral channel organic thin film transistor (OTFT) in accordance with various embodiments of the present disclosure.
Figure 2B:
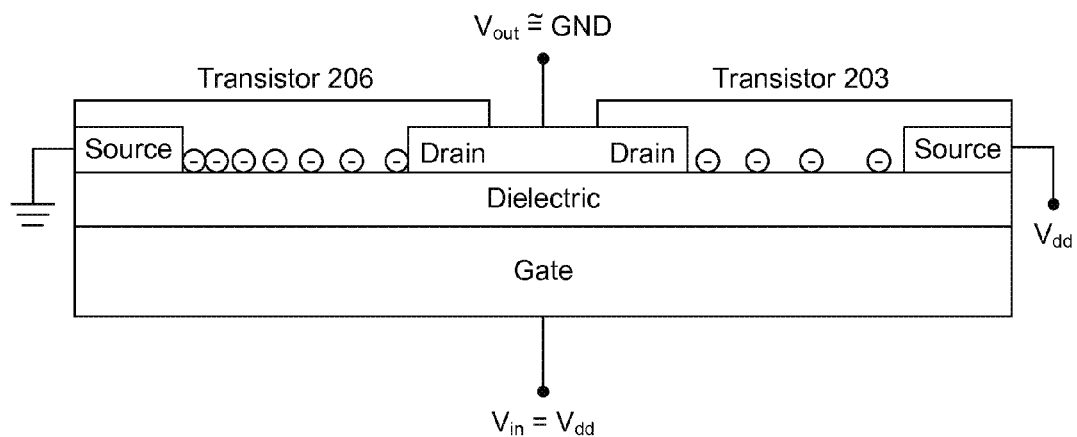

In contrast, a digital logic inverter built with two ambipolar lateral channel OTFTs consumes excess energy because neither transistor can ever be fully switched off, resulting in a perpetual leakage current passing through the device. As illustrated in FIG. 2A, when V$_{in}$ is grounded, because the source electrode of transistor 203 is connected to V$_{dd}$, there will be ample holes 209 induced across the channel of transistor 203 and the impedance across transistor 203 will be small, as desired. The source electrode of transistor 206 is grounded, so almost no charge is induced near that region. However, across the channel of transistor 206 the potential increases gradually resulting in successively more holes 212 induced along the channel towards the drain electrode of transistor 206. So transistor 206 is partially turned on. The impedance of transistor 206 is still larger than that of transistor 203, leading to a high output voltage (V$_{out}$) that's almost equal to V$_{dd}$. But constant current will flow through the inverter due to the fact that transistor 206 is not completely off. Similarly, as shown in FIG. 2B, when the input voltage (V$_{in}$) is set to V$_{dd}$, transistor 206 will be fully on but transistor 203 will also be partially on, resulting in a constant current flowing through the inverter circuit.

The perpetual leakage current may be avoided through the user of a carbon nanotube based vertical field effect transistor (CN-VFET). In one embodiment, a CN-VFET transistor includes of the following structural elements, which are listed sequentially from the bottom layer up: an electrically conducting gate electrode; an electrically insulating gate dielectric layer; a layer of nanotubes lying on their sides on the gate dielectric surface with a number density across the gate dielectric surface that forms an electrically interconnected random network of crossing, interconnected nanotubes but wherein, viewed from above, the nanotube network layer is sufficiently dilute to expose the underlying dielectric surface (e.g., at least as much of the underlying dielectric surface as is covered by nanotubes); a semiconducting channel layer that coats both the nanotubes and the regions of the exposed dielectric layer between near-lying nanotubes; and finally an electrically conducting top electrode layer. The nanotube network layer is termed the nanotube source electrode or just the source electrode and the top electrode layer is termed the drain electrode. Electrical contact to the nanotube layer may be made via a metallic source contact pad that can lie along one edge of the nanotube network layer (e.g., over or under a small portion of the nanotube network layer). The gate electrode is electrically isolated by the gate dielectric layer from the nanotube source electrode and the source contact pad except through a voltage source that provides the gate voltage (V$_G$) between the gate and the source electrodes. The drain electrode and the nanotube source electrode, which are electrically separated by the channel layer, are connected to a separate power source that applies a voltage between the source and the drain electrodes (V$_{SD}$).

In a CN-VFET transistor, carriers are injected from the underlying carbon nanotube (CNT) source electrode, passing vertically through the thin film channel and collected by the top drain electrode. The gate controls the source-drain current by modulating the injection barrier between the carbon nanotubes in the source random network and the organic semiconductor. In a p-channel CN-VFET, holes are injected from the Fermi level of the CNTs into the HOMO of the organic semiconductor, while in an n-channel CN-VFET, electrons are injected from the Fermi level of the CNTs into the LUMO level of the organic semiconductor. The gate field modulates the Fermi level position of the CNTs in the source random network to control the injection barrier between the CNTs and the organic semiconductor. In order to ensure that the gate field can turn the source-drain current ON and OFF, the HOMO level of the organic semiconductor for p-channel applications and LUMO level of the organic semiconductor for n-channel applications should lie near the Fermi level of the CNTs, for example, within 0.8 eV.

Figure 3:
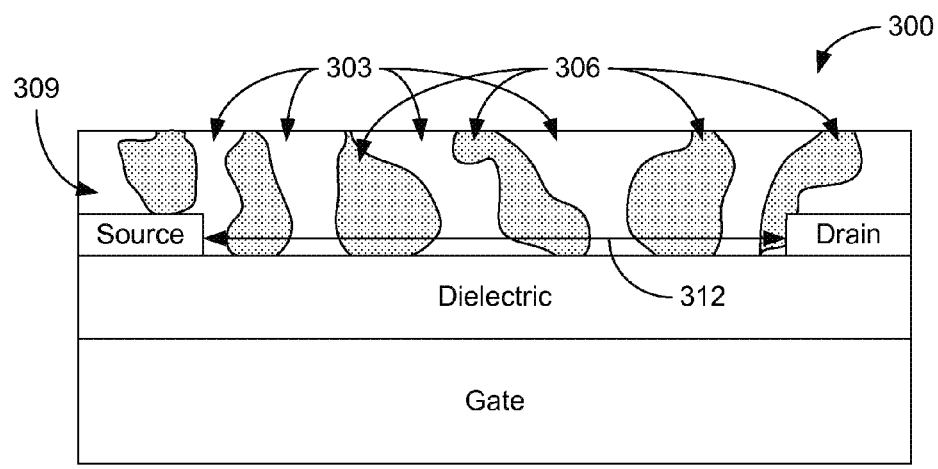
FIG. 3 is graphical representation of an example of a lateral channel organic semiconductor blend transistor in accordance with various embodiments of the present disclosure.

In the case of lateral channel organic semiconductor blend transistors, the most likely reason for the poor mobility is the non-percolating nature of the phase segregated domains of the two materials between the source and drain electrodes. Referring to FIG. 3, shown is a graphical representation of a lateral channel organic semiconductor blend transistor 300. As illustrated, the distinctly patterned regions 303 and 306 represent the two phase segregated components in a channel 309 between the source and drain. Because of the contact barriers at each interface between the discrete domains 303/306 and the existence of few (if any) percolating pathways of pure domains extending across the length 312 of the channel from the source to the drain, the current that flows through the channel is severely limited. The long channel length 312 of conventional lateral channel OTFTs of tens to hundreds of microns makes the problem particularly severe resulting in very low on-state currents.

Figure 4:
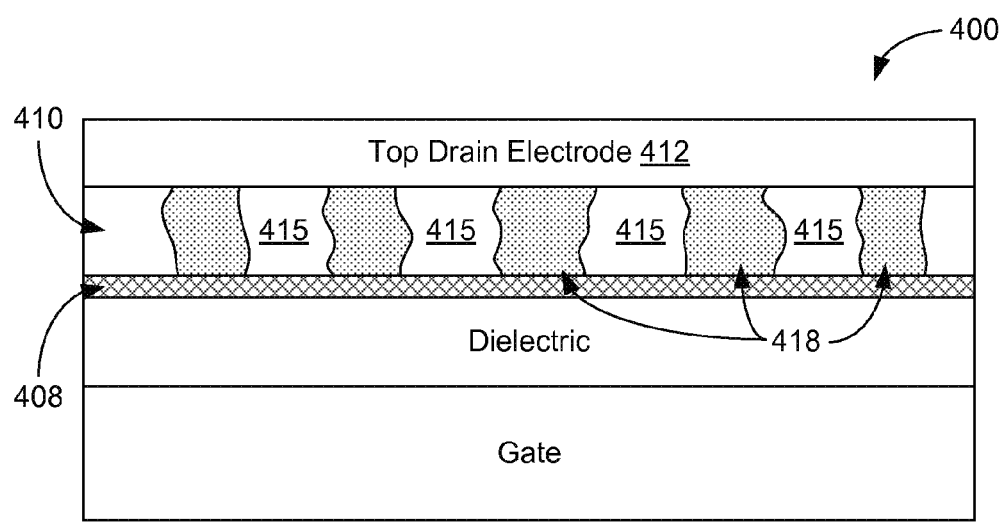
FIGS. 4 and 5A-5C are graphical representations of examples of ambipolar carbon nanotube vertical field effect transistors (CN-VFETs) in accordance with various embodiments of the present disclosure.

In contrast, by using a CN-VFET the channel length can be made so short that single crystalline grains of each material component phase can extend from the nanotube source electrode to the overlying drain electrode such that the bulk mobility of the materials is obtained. FIG. 4 is a graphical representation illustrating a CN-VFET with phase segregations 415 and 418 extending vertically between the CN source 408 and drain 412. Because of its thin channel layer 410, a phase segregated film can provide single crystal pathways 415/418 across the channel layer 410 in an ambipolar CN-VFET 400, realizing high channel mobility. The vertical pathways 415/418 between the CN source 408 and drain 412 can be satisfied by a film within which lateral phase segregation of the two components occurs. Phase segregations have been observed in many organic blends. The resulting low ON-state channel resistance may provide high operating speed and good noise immunity for digital inverters based on ambipolar CN-VFETs.

The ambipolar CN-VFET also exhibits a diode-like rectifying behavior. This benefits the performance of digital inverters including two ambipolar CN-VFETs. The diode-like behavior significantly reduces leakage current through ambipolar CN-VFET inverters when compared to lateral channel OTFT inverters.

Figure 5A:
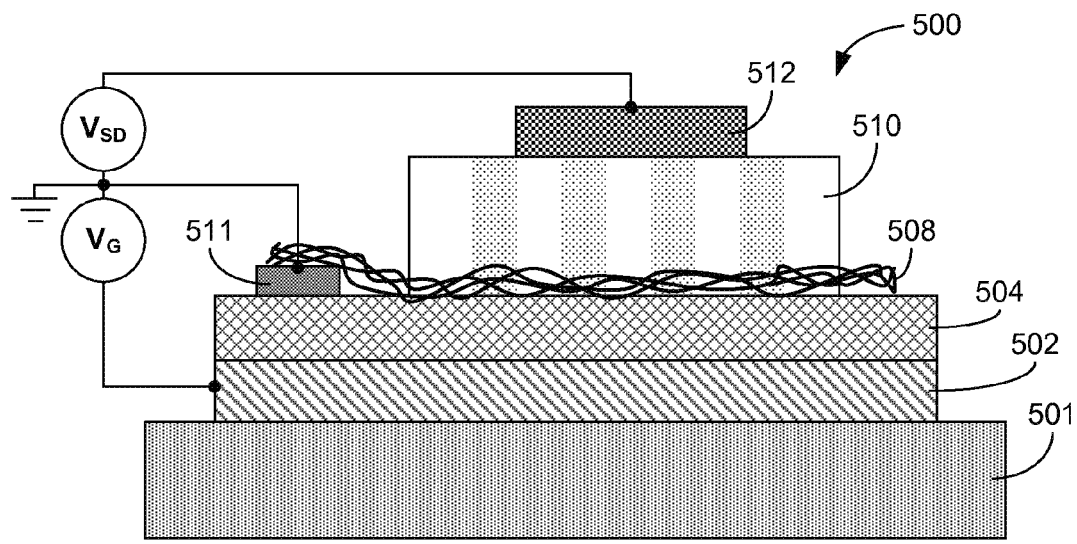
Figure 5B:
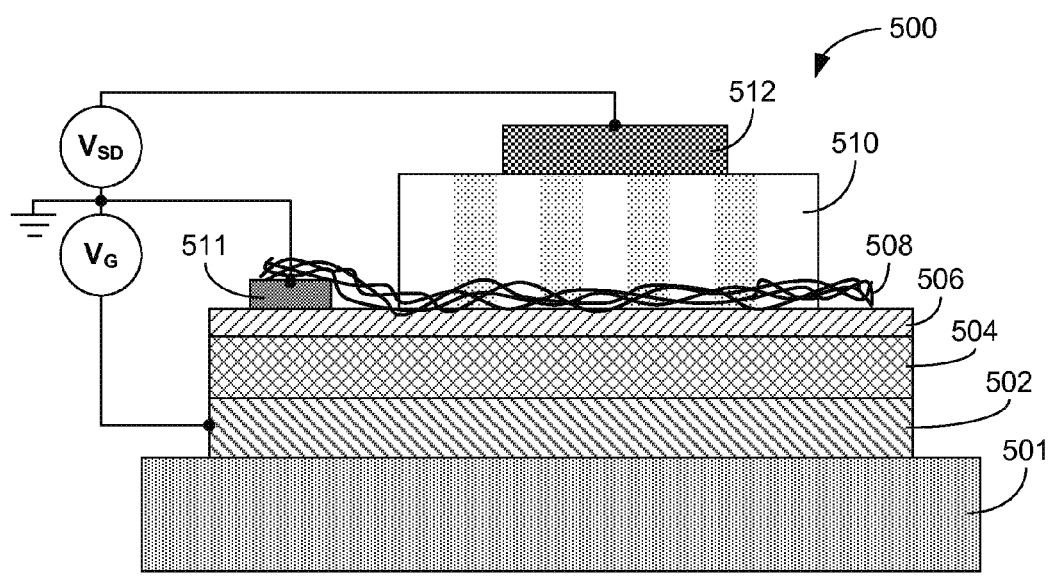

Turning now to FIGS. 5A and 5B, illustrated is a cross-sectional, two-dimensional diagram (thickness not to scale) of an ambipolar CN-VFET 500 in accordance with various embodiments of the present disclosure. The ambipolar CN-VFET 500 comprises a gate electrode 502 deposited on an insulating substrate 501, a dielectric layer 504 in contact with the gate electrode 502, and a source electrode 508 formed on at least a portion of the dielectric layer 504. In the example of FIGS. 5A and 5B, the source electrode 508 includes a dilute nanotube network. An electrical contact to the source electrode 508 may be made via a pre-deposited or post deposited metallic contact pad 511. FIG. 5 depicts a pre-deposited contact pad 511. Additionally, a semiconducting channel layer 510 is deposited on top of the source electrode 508 with a drain electrode 512 deposited on top of the semiconducting channel layer 510. In some embodiments, a dielectric surface treatment layer may be formed between the dielectric layer 504 and the source electrode 508. FIG. 5B illustrates an example of the ambipolar CN-VFET 500 including a dielectric surface treatment layer 506.

Referring back to FIGS. 5A and 5B, the gate electrode 502 includes an electrically conducting or semiconducting material. For example, in some embodiments the gate electrode 502 is a degeneratively doped p-type or n-type Si substrate, in which case the substrate layer 501 and gate electrode 502 are in a single layer that acts as the gate electrode 502. In other embodiments, the gate electrode 502 includes a metal such as, e.g., Al, Au, Ag, Pd, Pt, Ta, W, Cr, Mo, Cu, Zn, Mg, Cd, Sb, Ti, Sn, Sr and Bi, transparent conducting oxides such as, e.g., tin oxide, indium oxide, tin doped indium oxide, zinc oxide, cadmium oxide, magnesium doped indium oxide, gallium doped indium oxide, $CdSb_2O_6$, mixtures thereof and mixtures thereof doped with any of the metals from the group of, e.g., Al, Au, Ag, Pd, Pt, Ta, W, Cr, Mo, Cu, Zn, Mg, Cd, Sb, Ti, Sn, Sr, Bi, combinations thereof, and/or one or more of a variety of other metals or mixtures; any of which are deposited onto the insulating substrate 501.

The dielectric layer 504, which is formed on the gate electrode 502, comprises a dielectric material such as, e.g., silicon oxide, silicon nitride, $SiO_xN_y$, aluminum oxide, hafnium oxide, tantalum oxide, titanium oxide, lanthanum oxide, zirconium oxide, yttrium oxide, aluminum-titanium oxide, stacks or mixtures thereof, and/or one or more of a variety of other dielectric materials including but not limited to spin-on polymeric dielectrics such as benzocyclobutene (BCB) or other mixtures.

As shown in FIG. 5B, a dielectric surface treatment layer 506 may be formed on the dielectric layer 504. In some embodiments, the dielectric surface treatment layer 506 has a thickness ranging from <1 nm to about 1 μm. The effect of the dielectric surface treatment layer 506 may be to reduce the dielectric surface charge trap density. In some embodiments, the dielectric surface treatment layer 506 has an effect that will reduce the charge trap density on the interface between the dielectric layer 504 and the CNTs in the CNT random network source electrode 508, where the CNT source electrode 508 is in contact with the dielectric surface treatment layer 506 coated dielectric layer 504. In some embodiments, the dielectric surface treatment layer has an effect that will reduce the charge trap density on the interface between the dielectric layer 504 and the semiconducting channel layer 510, where the semiconducting channel layer 510 is in contact with the dielectric surface treatment layer 506 coated dielectric layer 504. The direct contact between the semiconducting channel layer 510 and the dielectric layer 504 or the dielectric surface treatment layer 506 coated dielectric layer 504 is possible on some portion of the dielectric layer 504 due to the fact that the CNT random network source electrode 508 is a dilute network where open spaces exist between the incidentally touching and overlapping nanotubes.

In some implementations, the dielectric surface treatment layer 506 may be a self-assembled monolayer. For example, n-octadecyltrichlorosilane (OTS) may be used as the dielectric surface treatment layer 506 on the dielectric layer 504 (which can be $SiO_2$ for example).

In some embodiments, the dielectric surface treatment layer 506 can include a plurality of layers of well-organized molecules. For example, the dielectric surface treatment layer 506 may include benzocyclobutene (BCB), which is a cross-linking, spin-on, low dielectric constant polymer. The BCB may be spun onto the dielectric layer 504 (which may be, e.g., $SiO_2$ or $Al_2O_3$) and annealed to form the dielectric surface treatment layer 506.

As discussed above, a source electrode 508 is formed on the dielectric layer 504 or on the dielectric surface treatment layer 506. In some embodiments, the source electrode 508 is a dilute, but electrically percolating, layer of individualized and/or bundled nanotubes, being primarily SWNTs, and in some embodiments, preferably consisting essentially of SWNTs. As used herein, "dilute" refers to a nanotube film having substantial regions of the dielectric layer 504 not covered by nanotubes and there exist appreciable lengths of nanotubes and thin nanotube bundles that do not have other nanotubes that are associated with this layer crossing either above or below them.

Further, "percolating" refers to a nanotube layer having a density of nanotubes (i.e., nanotubes per unit area) that is sufficient to provide electrical continuity from one end to the other end of the source electrode 508. A percolating nanotube film or network can be grown directly onto the dielectric layer 504 (or dielectric surface treatment layer 506) or deposited by one or more of a variety of suitable methods. In some embodiments, the nanotube source electrode 508 is electrically contacted by a metallic contact pad 511 that provides electrical contact to one or more edges of the nanotube layer. The metallization forms an ohmic contact with the nanotubes making up the source electrode 508. For example, gold may be employed for form the metallic contact pad 511.

In alternative embodiments, rather than carbon nanotubes, a dilute network of conducting or doped semiconducting nanowires can be used as the dilute percolating film for the source electrode 508 directly contacting the dielectric layer 504 or the dielectric surface treatment layer 506. Examples of such nanowires include, e.g., silver nanowires and silicon nanowires. In other implementations, a layer of graphene may be used. The graphene layer may be etched with a group of regularly or irregularly distributed holes that extend down to the surface of the dielectric 504 (or dielectric surface treatment layer 506). The holes throughout the graphene layer allow the semiconducting channel layer 510 to contact both the graphene and the dielectric surface layer 504 (or dielectric surface treatment layer 506).

Figure 5C:
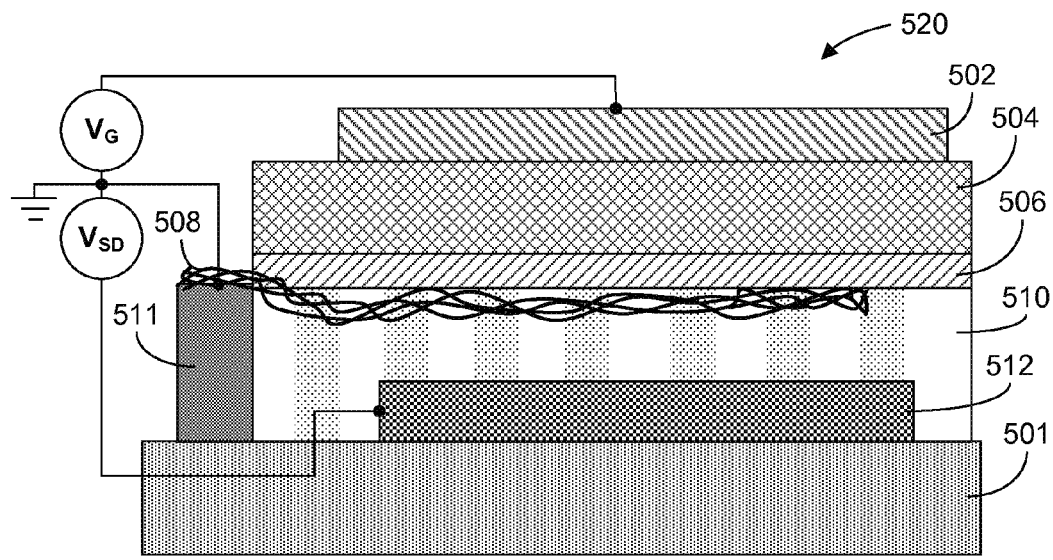

Referring now to FIG. 5C, illustrated is a cross-sectional, two-dimensional diagram (thickness not to scale) of another ambipolar CN-VFET 520 in accordance with various embodiments of the present disclosure. The ambipolar CN-VFET 520 comprises a drain electrode 512 deposited on an insulating substrate 501, and a semiconducting channel layer 510 is deposited on top of the drain electrode 512. A source electrode 508 is formed on at least a portion of the semiconducting channel layer 510. The source electrode 508 may include a dilute nanotube network. An electrical contact to the source electrode 508 may be made via a pre-deposited or post deposited metallic contact pad 511. FIG. 5 depicts a pre-deposited contact pad 511. In the example of FIG. 5C, a dielectric surface treatment layer 506 is deposited on top of the source electrode 508 and the semiconducting channel layer 510. A dielectric layer 504 is formed on the dielectric surface treatment layer 506 and a gate electrode 502 is deposited on the dielectric layer 504.

The device arrangement of FIGS. 5A-5C may be embodied as transparent transistors. Rather than a silicon back gate as the gate electrode 502, the gate electrode 502 can be a conducting material that is optically transparent such as, e.g., indium tin oxide or a thin SWNT or graphene film. The transparent gate electrode 502 can then be covered by an optically transparent dielectric layer 504 followed by the dilute, percolating, nanotube source electrode 508 followed by the rest of the device layers as previously discussed. A transparent conducting material may also be used for the drain electrode 512, such as, e.g., a thin nanotube or graphene film or a transparent conducting oxide layer or a dielectric-metal-dielectric transparent conductor. The device arrangement described is also amenable to the fabrication of flexible transistors requiring that SWNT films be used for the source, drain and gate layers with a flexible dielectric layer 504 constructed on a flexible insulating substrate 501.

The material or materials of the semiconducting channel layer 510 are appropriately chosen to make sure that the ambipolar CN-VFET 500 has ambipolar characteristics. In some embodiments, one or more types of p-channel semiconductor material and one or more types of n-channel semiconductor material together form the semiconducting channel layer 510. Assuming that the work function of the nanotube source electrode layer 508 is about −5.0 eV, possible p-channel materials include semiconducting materials with a HOMO level or valence band edge energy in the range of about −5.0 eV to about −7.0 eV or within about 2 eV below the Fermi level. Possible n-channel materials include semiconducting materials with a LUMO level or conduction band edge energy in the range of about −3.0 eV to about −5.0 eV or within about 2 eV above the Fermi level. In other embodiments, other materials such as, e.g., graphene, silicon or metallic nanowire, etc. may be used in the source electrode layer. Depending on the work function of the material used in the source electrode layer, the energy ranges may be shifted to match the corresponding work function of the material. In these embodiments, p-channel transport is enabled by continuous pathways extending within the semiconducting channel layer 510 between the source electrode 508 and the drain electrode 512 formed by the p-channel semiconductors and n-channel transport is enabled by continuous pathways extending within the semiconducting channel layer 510 between the source electrode 508 and the drain electrode 512 formed by n-channel semiconductors.

In some embodiments, a p-channel semiconducting material and n-channel semiconducting material are both solution processable by a common solvent. In those embodiments, the two semiconducting materials may be mixed together in solid form prior to being dissolved together in a common solvent or a first semiconducting material can be dissolved by the common solvent, followed by the addition of the second semiconducting material into the solution to form a solution of the two semiconducting materials. Solution processing techniques like spin-coating, ink-jet printing, vapor-jet printing, drop-casting or other means can be used to form the semiconducting channel layer 510.

In some embodiments, the semiconducting channel layer 510 may be formed through a sol-gel process where a solution or colloid of precursors are deposited onto the dilute, percolating, nanotube source electrode 508 covered dielectric layer 504. The deposited thin film then goes through a drying process to gain desired chemical constituents and physical structures. After the drying process an annealing or sintering process at elevated temperature can be carried out to further adjust the microstructure of the semiconducting channel layer 510 to form larger grains or highly conductive vertical current paths. Many inorganic semiconductors, especially metal oxide semiconductors can be formed through sol-gel process, including but not limited to zinc oxide (ZnO), indium zinc oxide (IZO), indium gallium zinc oxide (IGZO), zinc tin oxide (ZTO), indium zinc tin oxide (IZTO).

In some embodiments, the p-channel semiconducting material and the n-channel semiconducting material are not both solution processable by a common solvent. A first semiconducting material may be solution processable by a solvent while the second semiconducting material is not solution processable by any solvent to form a meaningful thickness or both of the semiconducting materials may not be solution processable by any solvent to form a meaningful thickness. In those embodiments, the two materials can be deposited sequentially by appropriate methods so the material forms a bilayer structure or achieves a mixture of the two materials by means of simultaneous deposition techniques such as thermal co-evaporation.

When the semiconducting channel layer 510 includes a mixture or blend of one or more types of p-channel semiconducting materials and one or more types of n-channel semiconducting materials, depending on the different components, the semiconducting channel layer 510 can be amorphous or polycrystalline, or a mixture of amorphous and polycrystalline phases. In some cases, the materials have a tendency to phase segregate while drying so as to retain their individual HOMO and LUMO levels. The semiconducting channel layer 510 may include one or more amorphous materials that alter the morphology, mechanical properties, and/or electronic properties of the semiconducting channel layer 510. The CN-VFET architecture by virtue of its short channel length can take full advantage of this property of the phase segregated semiconducting channel layer 510. The channel length between the source electrode 508 and the drain electrode 512 can be made so short that single crystalline grains of each material component phase extend all the way from the nanotube source electrode to the overlying drain electrode such that the bulk mobility of the materials is obtained. This criterion can be satisfied by a film within which a phase segregation of the two components occurs, as is illustrated in FIG. 4.

In some embodiments, the phase segregation of the semiconducting channel layer 510 will occur spontaneously when the layer is deposited, such as during drying of a spun-coat blend of a p-channel semiconductor and an n-channel semiconductor from a common solvent. To achieve better device characteristics, post-deposition treatment of the semiconducting channel layer 510, such as annealing at a specified elevated temperature, or exposure to the vapor of a specific solvent or solvents, may be used to realize improved semiconducting channel layer morphology.

In alternative embodiments, a single narrow band gap semiconductor may be used to form the semiconducting channel layer 510 to get ambipolar transport in the CN-VFET 500. Assuming a work function of the nanotube source electrode layer 108 of about −5.0 eV, materials that may be used for the single component semiconducting channel layer 510 include semiconducting materials with both a HOMO level or valence band edge energy in the range of about −5.0 eV to about −6.5 eV or within about 2 eV below the Fermi level and a LUMO level or conduction band edge energy in the range of about −3.5 eV to about −5.0 eV or within about 2 eV above the Fermi level. In these embodiments, the single component semiconducting channel layer 510 is responsible for both p-channel and n-channel transport.

The drain electrode 512 is formed on the semiconducting channel layer 510. In some embodiments, the drain electrode 512 includes a thin metallization deposited directly on top of the semiconducting channel layer 510. The drain electrode material may be selected to possess a work function such that the drain electrode 512 forms an injection barrier for both positive charge (hole) injection and negative charge (electron) injection into the semiconducting channel layer 510. The injection barrier between the drain electrode 512 and semiconducting channel layer 510 will ensure that neither holes nor electrons can be injected from the drain electrode 512 to the semiconducting channel layer 510. On the other hand, there is no large extraction barrier for both holes and electrons between the semiconducting channel layer 510 and the drain electrode 512, so under appropriate drain voltage and gate voltage conditions, holes or electrons injected from the source electrode 508 can cross the semiconducting channel layer 510 and be extracted or collected by the drain electrode 512. This can be understood as a Schottky diode formed at the drain electrode 512 between the non-injecting drain and each of the p-channel and n-channel materials with a blended semiconducting channel layer 510, or between the non-injecting drain and the narrow band gap semiconducting channel layer 510 (e.g., in a single component semiconducting channel layer 510), which may be represented by the circuit model illustrated in FIG. 6.

In some embodiments, the material of the drain electrode 512 may be selected to possess a work function such that the drain electrode 512 forms a large injection barrier for only positive charges (holes) into the semiconducting channel layer 510. In those embodiments, the electron extraction barrier between the semiconducting channel layer 510 and the drain electrode 512 can be kept at minimum, resulting in higher ON-state current for the n-channel transport of the ambipolar CN-VFET 500, at the expense of reduced control over the p-channel current in the ambipolar CN-VFET 500. The drain electrode 512 may form the injection barrier only for hole injection into the semiconducting channel layer 510 by selecting a particular drain material, by utilizing an interlayer between the drain layer 512 and the semiconducting channel layer 510, and/or by interface doping of the semiconducting channel layer 510.

In some embodiments, the material of the drain electrode 512 can be selected to possess a work function such that the drain electrode 512 forms a large injection barrier for only negative charges (electrons) into the semiconducting channel layer 510. In those embodiments, the hole extraction barrier between the semiconducting channel layer 510 and the drain electrode 512 can be kept at minimum, resulting in higher ON-state current for the p-channel transport of the ambipolar CN-VFET 500, at the expense of reduced control over the n-channel current in the ambipolar CN-VFET 500. The drain electrode 512 may form the injection barrier only for electron injection into the semiconducting channel layer 510 by selecting a particular drain material, by utilizing an interlayer between the drain layer 512 and the semiconducting channel layer 510, and/or by interface doping of the semiconducting channel layer 510.

Figure 6:
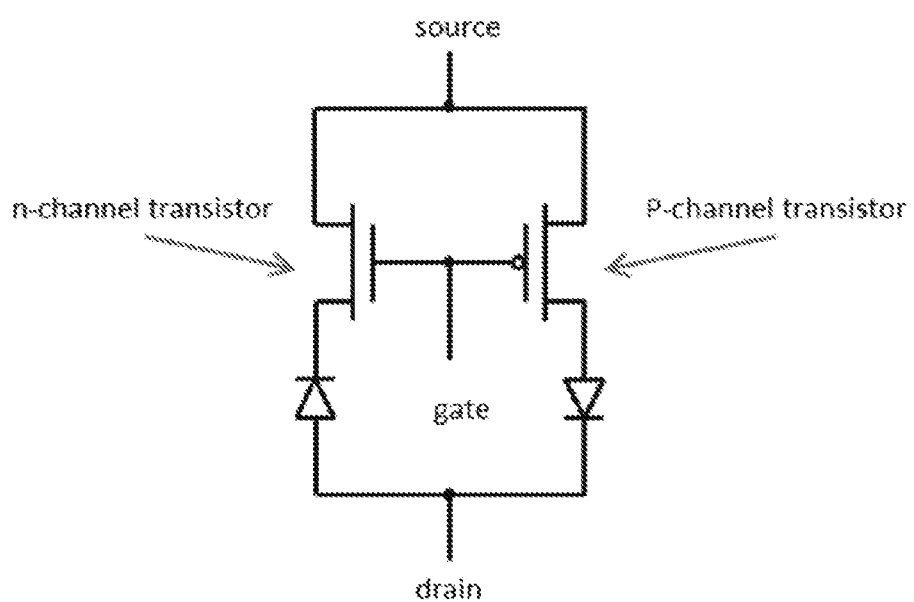
FIG. 6 is a schematic diagram of a circuit representing an ambipolar CN-VFET in accordance with various embodiments of the present disclosure.
Figure 7:
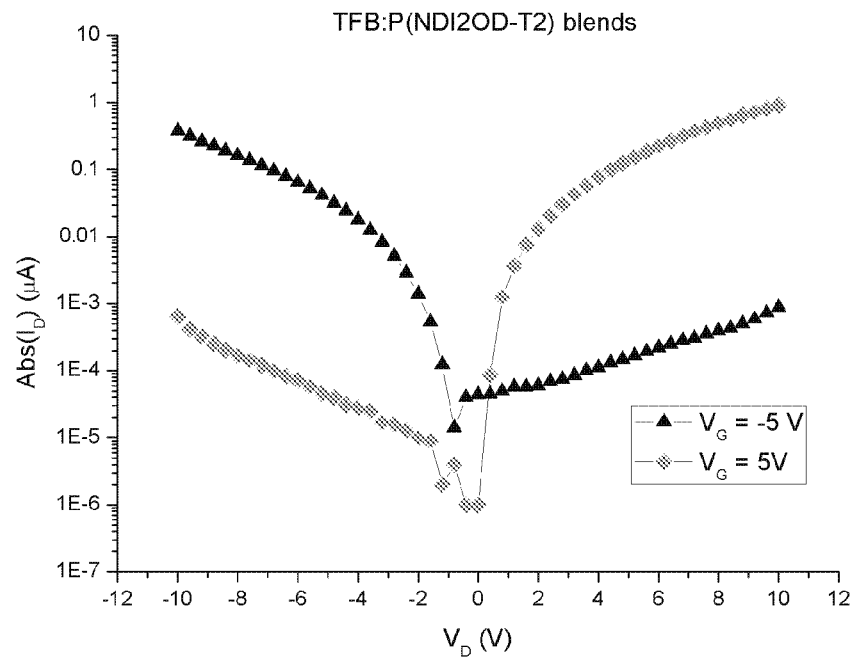
FIGS. 7 and 8 are plots of output curves of ambipolar CN-VFETs in accordance with various embodiments of the present disclosure.

In some embodiments, an ambipolar CN-VFET 500 including a drain electrode material that forms the built-in Schottky diode (as illustrated in FIG. 6) will exhibit a diode-like ambipolar transport characteristic on its output curves for both the n-type and p-type channels. An example such a device is an ambipolar CN-VFET 500 fabricated with a dilute CNT random network source electrode 508, a semiconducting channel layer 510 including a mixture (or blend) of p-channel organic semiconductor TFB (poly(9,9-dioctyl-fluorene-co-N-(4-butylphenyl)-diphenylamine)) and n-channel organic semiconductor Polyera ActivInk N2200 (P(NDI2OD-T2)) deposited by spin-coating a solution of TFB and P(NDI2OD-T2)) blend, and a thermally evaporated Au drain electrode 512. FIG. 7 is a plot of the output curves of the device. In this example, the Au top drain electrode 512 possesses a work function of about −5.1 eV, so an injection barrier will be formed between Au and TFB (with an HOMO level of about −5.4 eV) for holes, as well as between Au and (P(NDI2OD-T2)) (with a LUMO level of about −4.0 eV) for electrons. Power dissipation is minimized in ambipolar CN-VFET based inverter because of the low leakage current.

Figure 8:
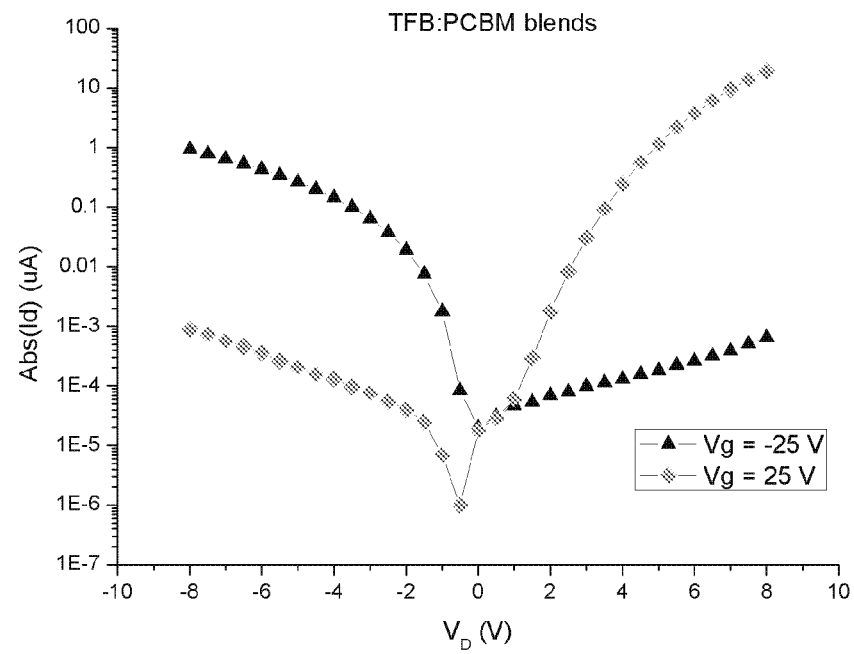

Another example of a device including a drain electrode material that forms the built-in Schottky diode is an ambipolar CN-VFET 500 fabricated with a dilute CNT random network source electrode 508, a semiconducting channel layer 510 including a mixture of p-channel organic semiconductor TFB and n-channel organic semiconductor [6,6]-phenyl-C61-butyric acid methyl ester (PCBM) deposited by spin-coating a solution of TFB and PCBM blends, and a thermally evaporated Au drain electrode 512. FIG. 8 is a plot of the output curves of this device. In this embodiment, the Au top drain electrode 512 possesses a work function of about −5.1 eV, so an injection barrier will be formed between Au and TFB (with an HOMO level of about −5.4 eV) for holes, as well as between Au and PCBM (with a LUMO level from about −3.75 eV to about −4.3 eV) for electrons.

Figure 9A:
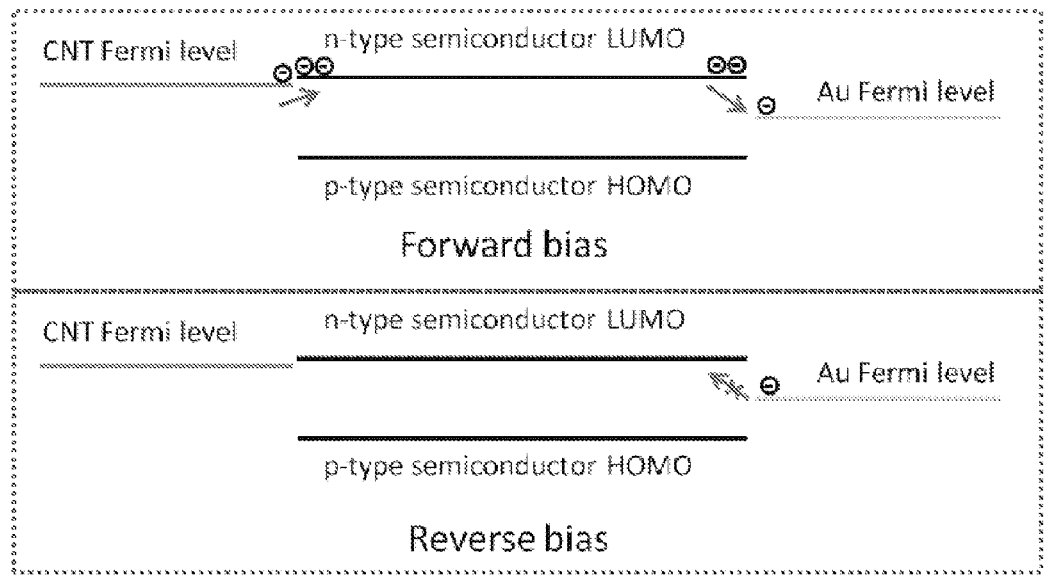
FIGS. 9A and 9B are schematic representations of the operation of an ambipolar CN-VFET in accordance with various embodiments of the present disclosure.
Figure 9B:
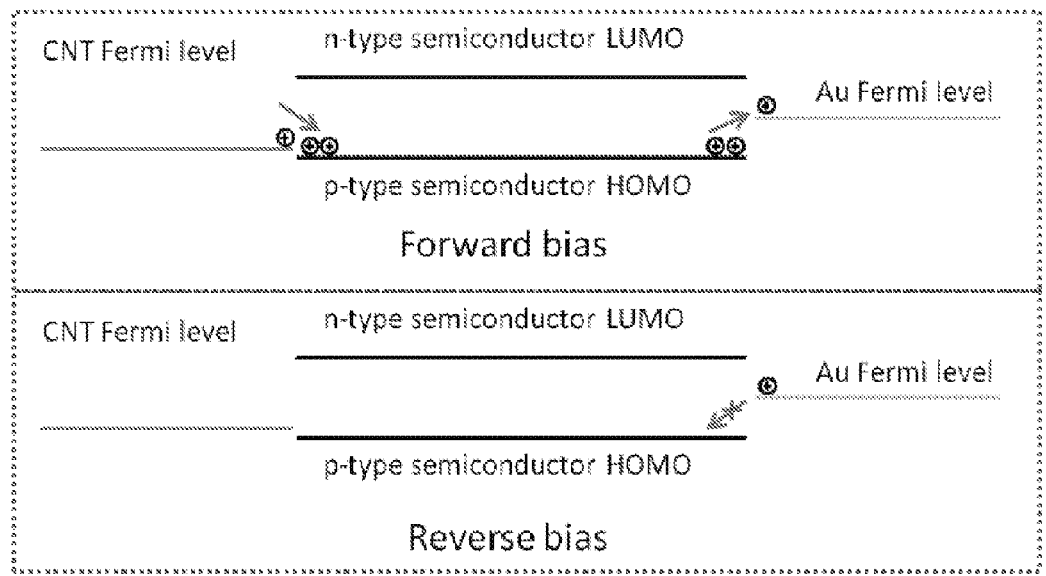

The output curves for the two devices of FIGS. 7 and 8 demonstrated experimentally that a Schottky diode formed between the gold drain electrode 512 and each of the p-channel and n-channel materials for both hole transport and electron transport. FIGS. 9A and 9B schematically represent how the diode behavior comes about. As shown in FIG. 9B, there is a significant barrier (reverse bias) for hole injection into the HOMO of the TFB from the top Au drain electrode 512. In addition, as shown in FIG. 9A, there is a significant barrier (reverse bias) for electron injection into the LUMO of the PCBM or the P(NDI2OD-T2). Unlike the injection barrier between the CNTs in the source electrode 508 and the organic semiconductors, the injection barrier between the top Au drain electrode 512 and the two semiconductors is unaffected by the gate electric field. Neither holes nor electrons can be injected from the drain electrode 512 due to this barrier, but both holes and electrons can pass to the drain electrode 512 from one or the other of the semiconducting materials (depending on the gate and the drain polarity). The result is that high currents flow only for simultaneously positive gate and positive drain or for simultaneously negative gate and negative drain with the current switching direction in the two cases. This bias behavior gives the ambipolar CN-VFET 500 important advantages over the ambipolar lateral channel transistor in device applications as will be discussed below.

A digital logic inverter built with two ambipolar lateral channel organic transistors (FIGS. 2A and 2B) consumes excess energy due to the fact that neither transistor can ever be fully switched off, so that there is always leakage current passing through the device. On the other hand, because of the diode-like characteristic of the ambipolar CN-VFET 500, the leakage current in an ambipolar CN-VFETs based inverter can be very small.

Figure 10:
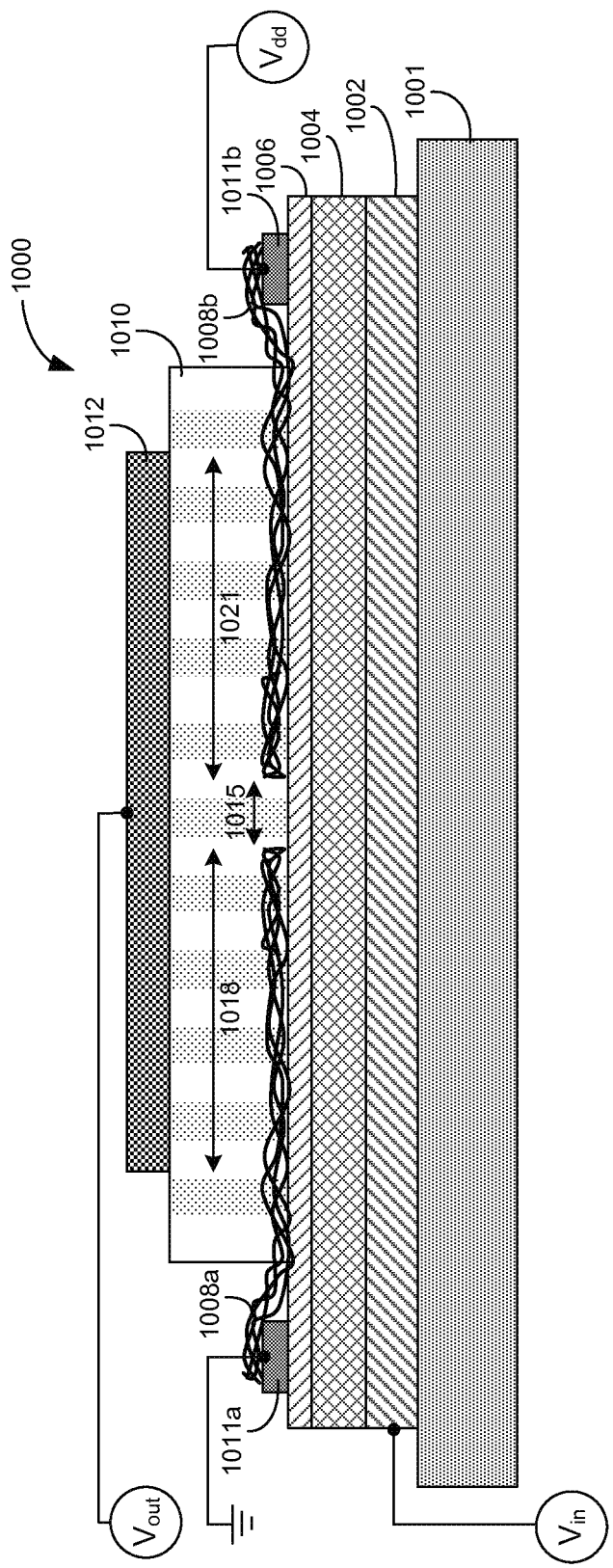

Digital inverters can be fabricated by coupling two ambipolar CN-VFETs. In some embodiments, two ambipolar CN-VFETs are coupled in a back-to-back fashion. FIG. 10 shows a cross-sectional diagram (thickness not to scale) of an example of a CN-VFET based digital inverter in accordance with various embodiments of the present disclosure. The digital inverter 1000 comprises a gate electrode 1002 deposited on an insulating substrate 1001, a dielectric layer 1004 in contact with the gate electrode 1002, a dielectric surface treatment layer 1006 in contact with the dielectric layer 1004, and two separate source electrodes 1008a and 1008b formed on at least a portion of the dielectric surface treatment layer 1006 coated dielectric layer 1004. Both of the source electrodes 1008a and 1008b include a dilute nanotube network. Electrical contacts to the source electrodes 1008a and 1008b are made via pre or post deposited metallic contact pads 1011a and 1011b, respectively. FIG. 10 depicts pre-deposited contact pads 1011. Additionally, a semiconducting channel layer 1010 is deposited on top of both of the source electrodes 1008a and 1008b with a drain electrode 1012 deposited on top of the semiconducting channel layer 1010.

The overlapping area between the first source electrode 1008a and the top drain electrode 1012 forms the active area of the first ambipolar CN-VFET, while the overlapping area between the second source electrode 1008b and the top drain electrode 1012 forms the active area of the second ambipolar CN-VFET. Both of these ambipolar CN-VFETs share the same gate electrode 1002. The two source electrodes 1008a and 1008b should be physically separated by a distance 1015 so that no significant current (compared with the OFF-state current of the ambipolar CN-VFETs) passes from one of the two source electrodes 1008, laterally through the semiconducting channel layer 1010 conveyed by the semiconductor bulk or any accumulation or inversion layer inside of the semiconducting channel layer 1010 created by gate field or any other electric field, to the other electrode 1008, under any $V_{in}$, and $V_{dd}$ in the working voltage range of the CN-VFET based inverter 1000, since any such current will be considered leakage current which is detrimental to the device performance.

In some embodiments, the overlapping area 1018 between the first source electrode 1008a and the top drain electrode 1012 (i.e., the active area of the first ambipolar CN-VFET) can be made different from the overlapping area 1021 between the second source electrode 1008b and the top drain electrode 1012 (i.e., the active area of the second ambipolar CN-VFET) to compensate for the mobility difference of the different carriers (i.e., electrons and holes) in the semiconducting channel layer 1010.

In some embodiments, when the mobility of holes and/or electrons are high enough in the semiconducting channel layer 1010 so that a reasonable distance separating the two source electrodes 1008a and 1008b is still not enough to yield low leakage current between the two source electrodes 1008, or an effort is needed to reduce the footprint of the CN-VFET based inverter by reducing the distance separating the two source electrodes 1008a and 1008b, the semiconducting channel layer 1010 can be separated by depositing two separated semiconducting channel layer 1010a and 1010b or by methods that can separate the semiconducting channel layer 1010 into independent layers 1010a and 1010b after the semiconducting channel layer 1010 deposition. FIGS. 11A and 11B illustrate examples of CN-VFET based digital inverters with separate semiconducting channel layers 1010a and 1010b. As in the example of FIG. 11A, the top drain layer 1012 can be shared by the two CN-VFETs. In the example of FIG. 11B, separate drain layers 1012a and 1012b are deposited on each semiconducting channel layer 1010a and 1010b, respectively, and connected together electrically through peripheral connections.

The operation procedure of a CN-VFET based inverter is described below with respect to FIG. 10. The source electrode 1008b of the CN-VFET on the right is connected to $V_{dd}$ through the contact pad 1011b, while the source electrode 1008a of CN-VFET on the left is grounded through the contact pad 1011a. When the gate 1002 is grounded, the hole injection barrier between the CNT source electrode 1008b and the semiconducting channel 1010 is lowered for the CN-VFET on the right, making the CN-VFET on the right a low impedance path for holes to travel from its source 1008b to the drain 1012. While for the CN-VFET on the left, the gate 1002 is at the same potential as its grounded source electrode 1008a, so the electron injection barrier is still high, making the CN-VFET on the left a high impedance path for electrons. Note that for either CN-VFET in the inverter 1000, because of the built-in Schottky diode present at the semiconductor-drain contact, neither electrons nor holes can be injected from the drain electrode 1012 into the semiconductor layer 1010, leaving the current through the CN-VFETs fully governed by the source injection. On the other hand, the built-in Schottky diodes readily pass holes or electrons from the semiconductor layer 1010 into the drain electrode 1012. As a result, the low impedance of the CN-VFET on the right and high impedance of the CN-VFET on the left produce an output voltage very near $V_{dd}$. The built-in Schottky diodes meanwhile minimize the leakage current through the series connected channels of both CN-VFETs. Similarly, when an input voltage at $V_{dd}$ is applied to the gate 1002, the CN-VFET on the right will be turned off while the CN-VFET on the left will be turned on, leading to an output voltage ($V_{out}$) near ground level at the output terminal. Again, the leakage current through the inverter is at a minimum.

In some embodiments, the inverter can be formed with two ambipolar CN-VFETs in a way that one CN-VFET (CN-VFET 1) features a non-injecting drain electrode for only holes, while the other CN-VFET (CN-VFET 2) features a non-injecting drain electrode for only electrons. In this case, CN-VFET 1 may be optimized for its n-channel operation and CN-VFET 2 may be optimized for its p-channel operation. The polarity to connect CN-VFET 1 and CN-VFET 2 is important in this case. Between the potential levels of ground and $V_{dd}$, the source electrode of CN-VFET 1 should be connected to the lower potential side and the source electrode of CN-VFET 2 should be connected to the higher potential side.

Figure 12A:
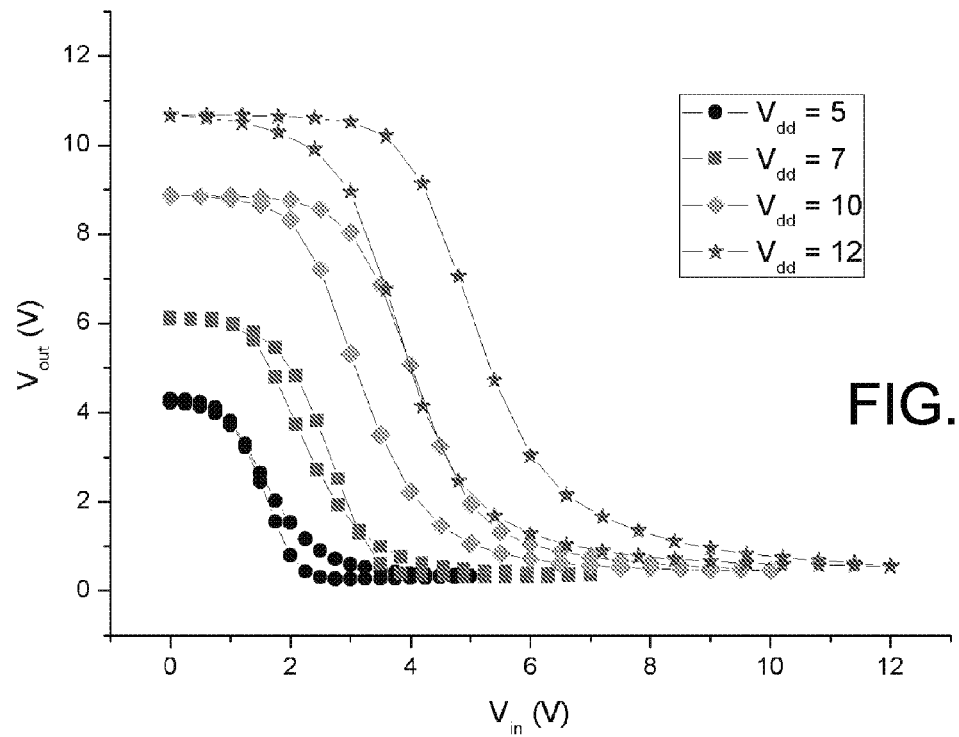
FIGS. 12A-12B are plots of output curves of digital inverters including ambipolar CN-VFETs in accordance with various embodiments of the present disclosure.
Figure 12B:
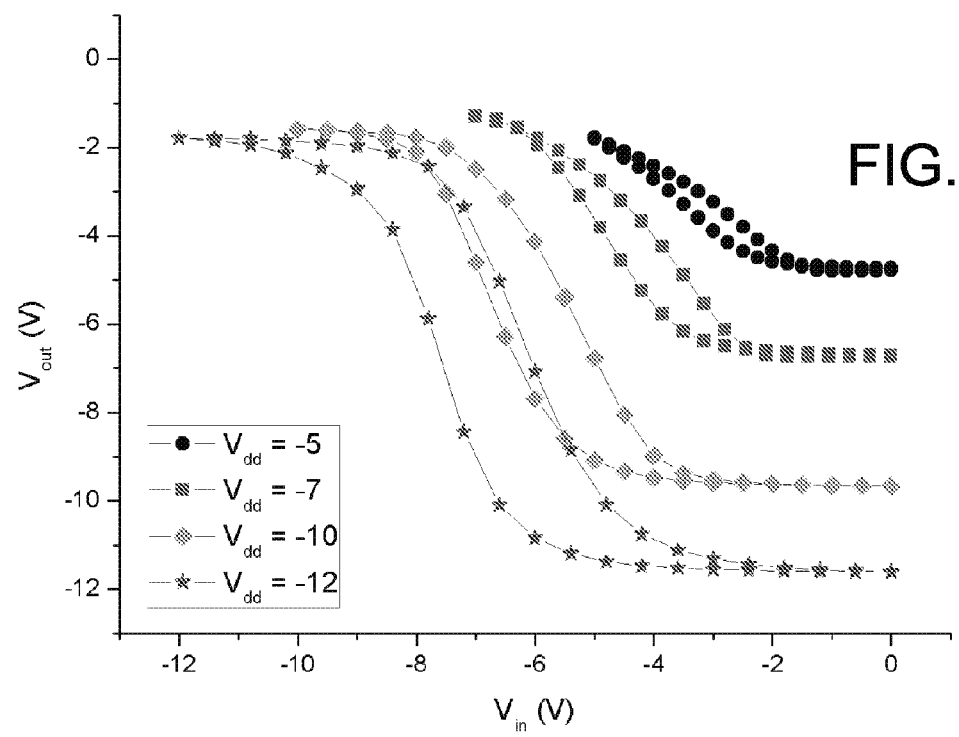
Figure 12C:
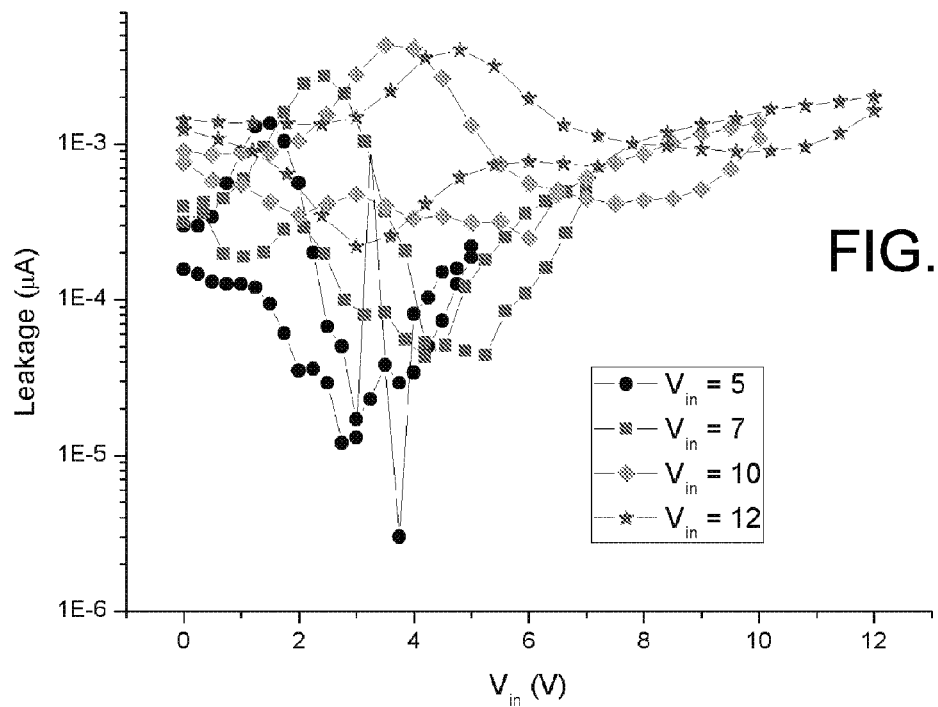
FIGS. 12C-12D are plots of static leakage current characteristics of digital inverters including ambipolar CN-VFETs in accordance with various embodiments of the present disclosure.
Figure 12D:
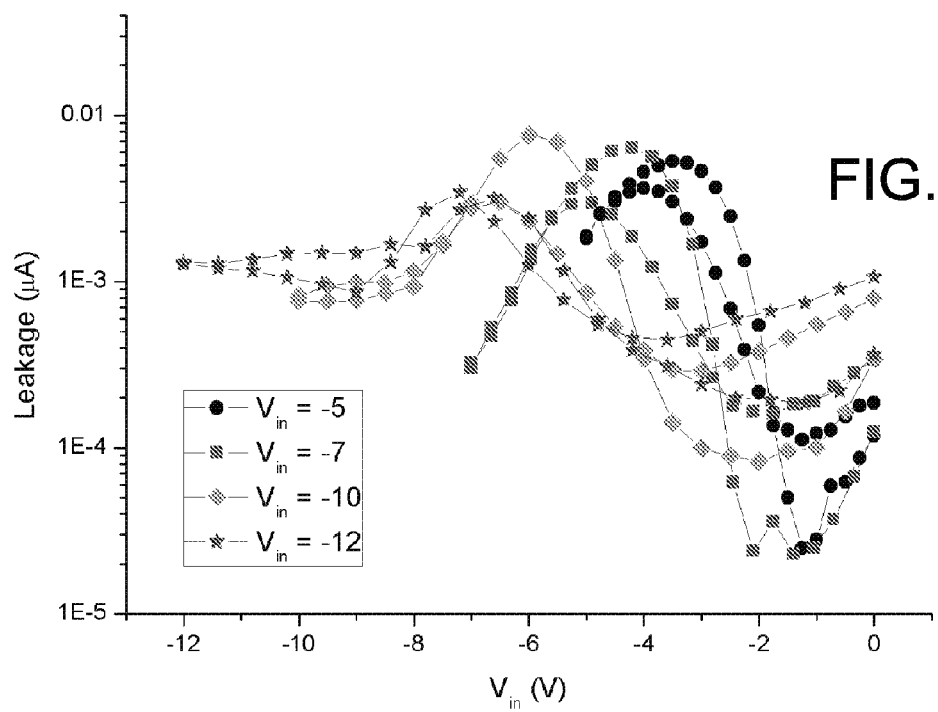
Figure 13A:
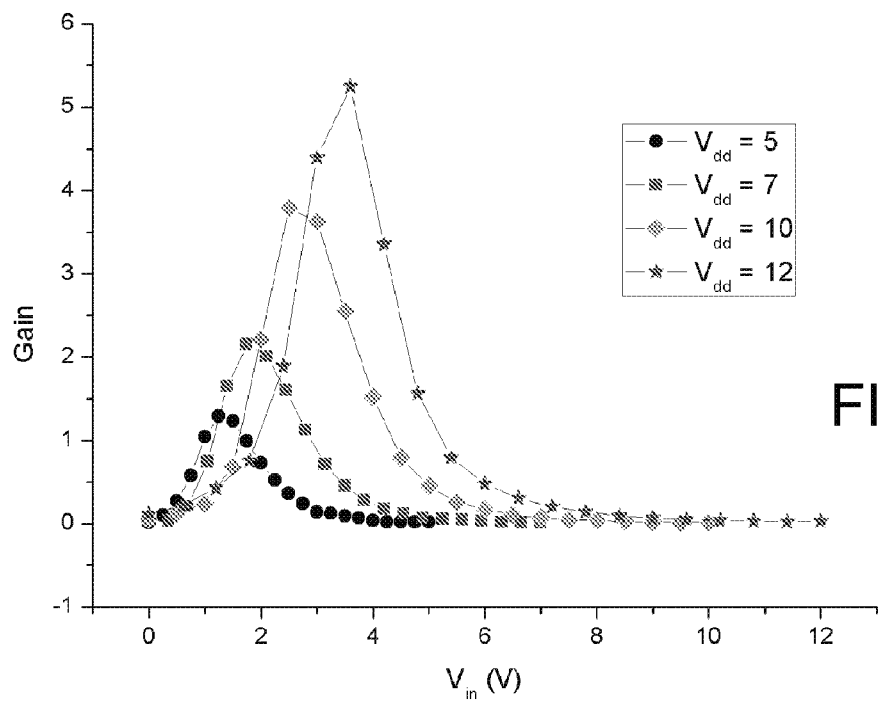
FIGS. 13A-13B are plots of gain characteristics of digital inverters including ambipolar CN-VFETs in accordance with various embodiments of the present disclosure.
Figure 13B:
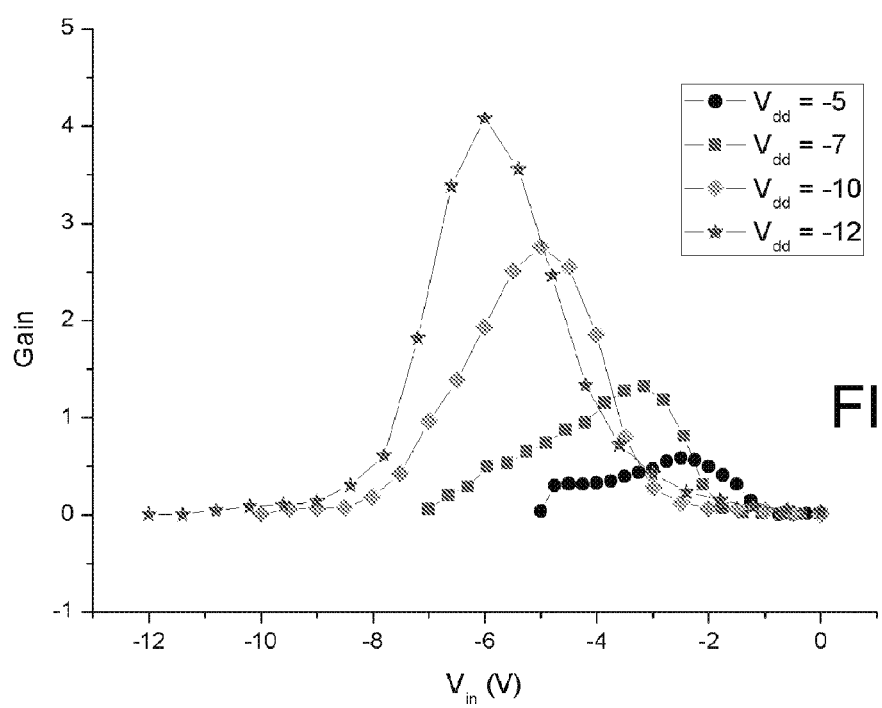

Referring to FIGS. 11A-11D, shown are output characteristics of an inverter based on TFB:P(NDI2OD-T2) ambipolar CN-VFETs. FIG. 12A shows the first quadrant characteristics where $V_{dd}$ and $V_{in}$ are positive and FIG. 12B shows the third quadrant characteristics where $V_{dd}$ and $V_{in}$ are negative. The leakage currents in both cases are plotted in FIGS. 12C and 12D, respectively. As can be seen in FIGS. 12C and 12D, the leakage currents are low, so that the static power consumption is minimized. An ideal inverted has infinite gain at the transition between the two states (i.e., $dV_{out}/dV_{in}=\infty$). In contrast, a real world non-ideal inverter has a finite gain. However, a gain that is at least larger than 1 is needed for the inverter to be useful and a larger gain is preferred to give the device better noise rejection. Plotted in FIGS. 13A and 13B are the gains of the inverter operating at different $V_{dd}$ levels in the first and third quadrants, respectively. As can be seen, the inverter can be useful at $V_{dd}$ levels greater than 5 volts.

Figure 14:
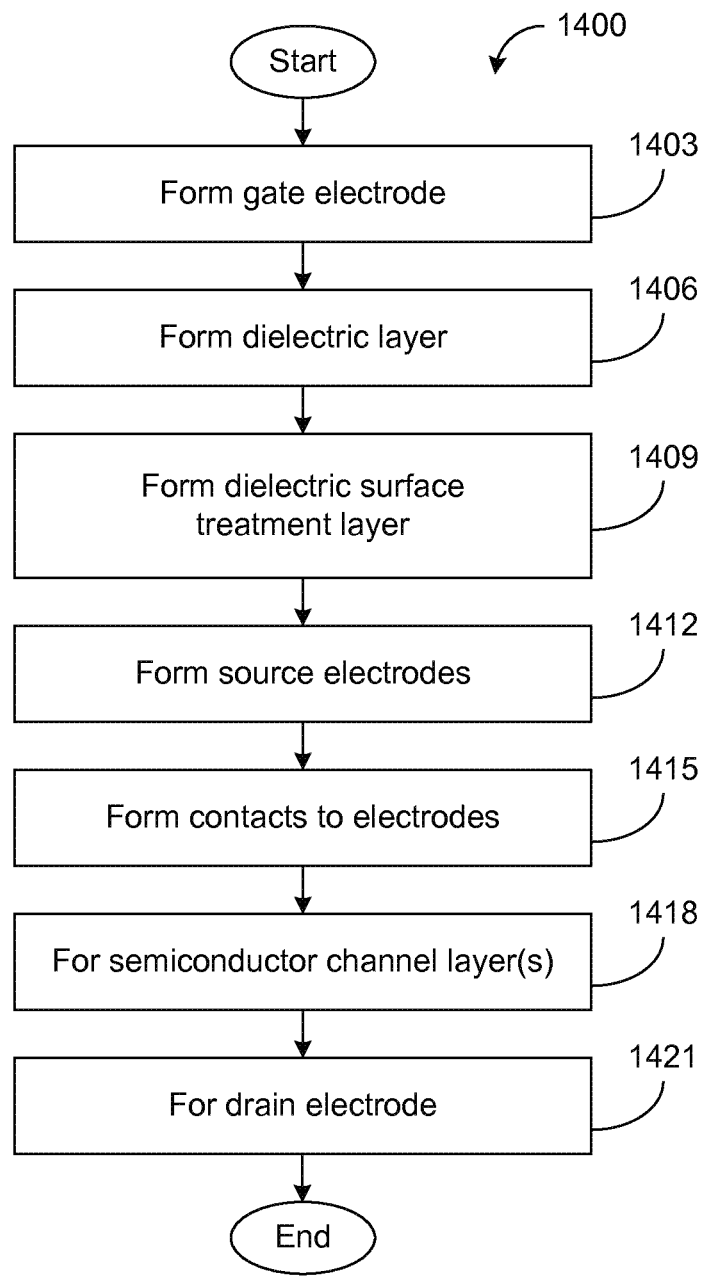
FIG. 14 is a flow chart illustrating an example of the fabrication of an ambipolar CN-VFET in accordance with various embodiments of the present disclosure.

Turning now to FIG. 14, shown is a flowchart 1400 illustrating an example of the fabrication of an ambipolar CN-VFET based digital inverter 1000 (FIGS. 10 and 11A-11B) in accordance with various embodiments of the present disclosure. Beginning with 1403, a gate electrode 1002 is formed, e.g., on a substrate 1001. A dielectric layer 1004 then formed on the gate electrode 1002 in 1406. A dielectric surface treatment layer 1006 may be formed on the dielectric layer 1004 in 1409. In some embodiments, a dielectric surface treatment layer 1006 may not be included in the digital inverter 1000. In 1412, source electrodes 1008 are formed on the dielectric surface treatment layer 1006 (or on the dielectric layer 1004). Each of the source electrodes 1008 may include at least one carbon nanotube. A proper distance is maintained between the source electrodes 1008 to ensure that no significant leakage current flows between the source electrodes 1008. The shapes and relative position of the source electrodes 1008 can be defined by photo lithography and subsequent etching processes.

Contacts pads 1011 may be formed on a portion of each of the source electrodes 1008 in 1415. In some implementations, contact pads 1011 may be formed on the dielectric layer 1004 or the dielectric surface treatment layer 1006 before the source electrodes 1008 are formed on the contact pads 1011. In 1418, one or more semiconducting channel layer(s) 1010 can be formed covering at least a portion of each the source electrodes 1008. As single semiconducting channel layer 1010 may be used as illustrated in FIG. 10 or individual semiconducting channel layers 1010 may be used as shown in FIGS. 11A and 11B. The thickness of the semiconducting channel layer(s) 1010 (i.e., the channel length of the CN-VFETs) is determined by the processing parameters of the method for depositing the semiconductor materials, such as spin-coating, thermal evaporation, and/or one or more of a variety of other thin film deposition techniques. In 1421, one or more drain electrode(s) 1012 is formed on the semiconducting channel layer 1010. The phase segregated pathways of the semiconducting channel layer 1010 that run between the source electrodes 1008 and the drain electrode 1012 allows for current flow.

The flow chart of FIG. 14 shows functionality and operation of a possible implementation of the formation of an ambipolar CN-VFET based digital inverter 1000 of FIGS. 10 and 11A-11B. It should also be noted that in some alternative implementations, the functions noted in the blocks may occur out of the order noted in FIG. 14. For example, two blocks shown in succession in FIG. 14 may in fact be executed substantially concurrently or the blocks may sometimes be executed in the reverse order, depending upon the functionality involved.

One embodiment, among others, includes an ambipolar vertical field effect transistor comprising a gate layer; a source layer that is electrically percolating and perforated; a dielectric layer disposed between the gate layer and the source layer; a drain layer; and a semiconducting channel layer disposed between the source layer and the drain layer, where the semiconducting channel layer is in contact with at least a portion of the source layer and at least a portion of the dielectric layer, and where the source layer and the semiconducting channel layer form a gate voltage tunable charge injection barrier. Another embodiment includes an ambipolar vertical field effect transistor comprising a gate layer; a dielectric surface treatment layer; a dielectric layer disposed between the gate layer and the dielectric surface treatment layer; a source layer that is electrically percolating and perforated, where the dielectric surface treatment layer is disposed between the source layer and the dielectric layer; a drain layer; and a semiconducting channel layer disposed between the source layer and the drain layer, where the semiconducting channel layer is in contact with at least a portion of the source layer and at least a portion of the dielectric surface treatment layer, and where the source layer and the semiconducting channel layer form a gate voltage tunable charge injection barrier.

The semiconducting channel layer may comprise single crystal grains that extend through the semiconducting channel layer and contact both the source layer and the drain layer to form high carrier mobility channels within the semiconducting channel layer. The semiconducting channel layer may comprise crystal grains that interconnect with other crystal grains to form high carrier mobility channels that extend through the semiconducting channel layer and connect the source layer and the drain layer. The semiconducting channel layer may comprise a plurality of p-type semiconductors that crystalize, a plurality of n-type semiconductors that crystalize, and/or an amorphous material that alters the morphology of the semiconducting channel layer.

The semiconducting channel layer may comprise a mixture of a p-channel organic semiconductor and an n-channel organic semiconductor, wherein the p-channel organic semiconductor has a HOMO level that is within 2 eV below the Fermi level of the source layer material and the n-channel organic semiconductor has a LUMO level that is within 2 eV above the Fermi level of the source layer material. The semiconducting channel layer may comprise a phase separated structure with the p-channel organic semiconducter and the n-channel organic semiconductor forming discrete domains. The discrete domains of p-channel organic semiconductor may form high mobility pathways for hole transport between the source layer and the drain layer. The discrete domains of n-channel organic semiconductor may form high mobility pathways for electron transport between the source layer and the drain layer.

The semiconducting channel layer may comprise a narrow band gap organic semiconductor which possesses a HOMO level able to accept hole injection from the source layer, and a LUMO level able to accept electron injection from the same source layer. The gate layer may include heavily dopes p-type silicon and the semiconducting channel layer may include a mixture of poly(9,9-dioctyl-fluorene-co-N-(4-butylphenyl)-diphenylamine) (TFB) and [6,6]-phenyl-C61-butyric acid methyl ester (PCBM). In other embodiments, the semiconducting channel layer may include a p-type small molecule organic semiconductor such as, e.g., compounds with a 1,3,5-triarylbenzene central core, fused heterocyclic aromatic compounds, macrocycles, N,N,N',N'-tetraarylbenzidines, oligoarylenevinylenes, oligofluorenes, oligothiophenes and their analogues, phenylene-thienylene oligomers, polycyclic aromatic compounds, spiro compounds, tetrathiafulvalene derivatives, or tris(oligoarylenyl)amines. In some embodiments, the semiconducting channel layer may include a n-type small molecule organic semiconductor such as, e.g., fullerene based compounds, fluorinated materials and analogues, or naphthalene and perylene based compounds. In other embodiments, the semiconducting channel layer may include p-type polymer organic semiconductors, n-type polymer organic semiconductors, or ambipolar organic semiconductors.

P-type small molecule organic semiconductors can include, but are not limited to: a) compounds with a 1,3,5-triarylbenzene central core such as, e.g., 1,3,5-Tris(5''-decyl-2,2':5',2''-terthien-5-yl)benzene; b) fused heterocyclic aromatic compounds such as, e.g., bis(dithienothiophene) (BDT), 2,6-DiphenylDithieno[3,2-b:2',3'-d]thiophene (DPh-DTT), 5,5'-bis-biphenyl-dithieno[3,2-b:2',3'-d]thiophene (BPDTT), 2,5-Bis(4-biphenylyl)-thieno[3,2-b]thiophene (BPTT), 2,5-Bis-(9H-fluorene-2-yl)-thieno[3,2-b]thiophene (BFTT), dinaphtho[2,3-b:2',3'-f]thieno[3,2-b]thiophene (DNTT), dianthra[2,3-b:2',3'-f]thieno[3,2-b]thiophene (DATT), 2,7-Diphenyl[1]benzothieno[3,2-b][1]benzothiophene (DPh-BTBT), 2,7-dioctyl[1]benzothieno[3,2-b][1]benzothiophene (C8-BTBT), Dibenzo[d,d']thieno[3,2-b;4,5-b']dithiophene (DBTDT), dithieno[2,3-d:2',3'-d']thieno[3,2-b:4,5-b']dithiophene (pentathienoacene, PTA), benzoannulated pentathienoacene (f-B5 TB), and bis(benzo[4,5]-thieno)[2,3-b:3',2'-d]thiophene; c) macrocycles such as, e.g., titanium oxide phthalocyanine (TiOPc), and Pt(II) Octaethylporphine (PtOEP); d) N,N,N',N'-tetraarylbenzidines such as, e.g., N,N'-bis(naphthalen-1-yl)-N,N'-bis(phenyl)-benzidine (NPB), and N,N'-bis(3-methylphenyl)-N,N'-bis(phenyl)-benzidine (TPD); e) oligoarylenevinylenes such as, e.g., oligothienylenevinylene, and 1,4-bis(vinylene-(N-hexyl-2-carbazole))phenylene (CPC), N-methyl-2,7-bis(vinylene-(7-hexyl-N-methyl-2-carbazole))carbazole (RC-CCR); f) oligofluorenes such as, e.g., F(MB)10F(EH)2, F(Pr)5F(MB)2; g) oligothiophenes and their analogues such as, e.g., 5,5-dihexyl-2,2':5',2'':5'',2''':5''',2''''-sexithiophene, 5,5'-Bis-(7-cyclohexyl-9H-fluoren-2-yl)-2,2'-bithiophene (CHFTTF), Dicyclohexyl-[2,2':5',2'':5''',2''']quaterthiophene (CH4T), p-quinquephenyl (p-5P), and p-sexiphenyl (p-6P); h) phenylene-thienylene oligomers such as, e.g., 5,5'-di(biphenyl-4-yl)-2,2'-bithiophene (BP2T), 5,5'-di(9H-fluoren-2-yl)-2,2'-bithiophene (FTTF), 5,5'-bis(7-hexyl-9H-fluoren-2-yl)-2,2'-bithiophene (DH-FTTF), α,ω-bis(biphenyl-4-yl)-terthiophene (BP3T), and 5,5'-bis(7-dodecyl-9H-fluoren-2-yl)-2,2'-bithiophene (Ddodec-FTTF); i) polycyclic aromatic compounds, such as, e.g., 6,13-bis(triisopropylsilylethynyl)pentacene (TIPS-pentacene), anthra[2,3-b:6,7-b']dithiophene (ADT), 5,12-diphenyltetracene (DPT), pentacene, 6,13-diphenylpentacene, and 6,13-dichloropentacene (DCP), 5,6,11,12-tetraphenyltetracene (rubrene); j) spiro compounds such as, e.g., 2,2',7,7'-tetrakis(N,N-diphenylamino)-9,9-spirobifluorene (Spiro-TAD), and 2,2',7,7'-tetrakis[N-naphthalenyl(phenyl)-amino]-9,9-spirobifluorene (Spiro-2NPB); k) tetrathiafulvalene derivatives such as, e.g., tetramethyltetraselenafulvalene (TMTSF), dithiophene-tetrathiafulvalene (DT-TTF), and dibenzo-tetrathiafulvalene (DB-TTF); and l) tris(oligoarylenyl)amines such as, e.g., Tris(4-(thiophen-2-yl)phenyl)amine (TTPA), Tris(4-(5-phenylthiophen-2-yl)phenyl)amine (TPTPA), tris(9,9-dimethylfluoren-2-yl)amine (TFlA), tris[4-(2-selenyl)phenyl]amine (TSePA), and 9,9-bis[4-(N,N-bis-naphthalen-2-yl-amino)phenyl]-9H-fluorene (NPAPF).

P-type polymer organic semiconductors can include, but are not limited to: Poly[(9,9-di-n-octylfluorenyl-2,7-diyl)-alt-2,2'-bithiophene-5,5'-diyl)] (F8T2); Poly[bis(3-dodecyl-2-thienyl)-2,2'-dithiophene-5,5'-diyl] (PQT-12); Poly[2,5-bis(3-dodecylthiophen-2-yl)thieno[3,2-b]thiophene] (PBTTT-12); PBTTT-14, PBTTT-16; Poly[(5,6-dihydro-5-octyl-4,6-dioxo-4H-thieno[3,4-C]pyrrole-1,3-diyl){4,8-bis[(2-butyloctyl)oxy]benzo[1,2-b:4,5-b']dithiophene-2,6-diyl}] (PBDTBO-TPDO); Poly[N-9'-heptadecanyl-2,7-carbazole-alt-5,5-(4',7'-di-2-thienyl-2',1',3'-benzothiadiazole)]; Poly[[9-(1-octylnonyl)-9H-carbazole-2,7-diyl]-2,5-thiophenediyl-2,1,3-benzothiadiazole-4,7-diyl-2,5-thiophenediyl] (PCDTBT); Poly[bis(4-phenyl)(2,4,6-trimethylphenyl)amine] (PTAA); Poly[(9,9-dioctylfluorenyl-2,7-diyl)-co-bithiophene]; Poly(3-dodecylthiophene-2,5-diyl); Poly[2-methoxy-5-(3',7'-dimethyloctyloxy)-1,4-phenylenevinylene]; Poly[(9,9-dioctylfluorenyl-2,7-diyl)-co-(4,4'-(N-(4-sec-butylphenyl) diphenylamine)] (TFB); and Poly[N,N'-bis(4-butylphenyl)-N,N'-bis(phenyl)-benzidine] (Poly-TPD).

N-type small molecule organic semiconductors can include, but are not limited to: a) fullerene based compounds such as, e.g., Fullerene-C60, Fullerene-C70, Fullerene-C84, (6,6)-phenyl-C61 butyric acid methyl ester (PCBM), indene-C60 bisadduct (ICBA), and C60,N,N,N-trimethyl-1-(2,3,4-tris(2-(2-methoxyethoxy)ethoxy)phenyl)methanaminium monoadduct (PrC60MA); b) fluorinated materials and analogues such as, e.g., Copper(II) 1,2,3,4,8,9,10,11,15,16,17,18,22,23,24,25-hexadecafluoro-29H,31H-phthalocyanine (F16CuPc), 5,5'-bis((5-perfluorohexyl)thiophen-2-yl)-2,2'-bithiophene (DFH-4T), perfluoropentacene, and 2,7-[bis-(5-perfluorohexylcarbonylthien-2-yl)]-4H-cyclopenta[2,1-b:3,4-b']-dithiophen-4-one (DFHCO-4TCO); and c) naphthalene and perylene based compounds such as, e.g., Bisbenzimidazo[2,1-a:1',2-b']anthra[2,1,9-def:6,5,10-d'e'f'] diisoquinoline-10,21-dione (PTCBI), 3,4,9,10-perylenetetracarboxylic acid diimide (PTCDI), 1,4,5,8-naphthalenetetracarboxylic dianhydride (NTDA), N,N'-bis[2-(2,4-dichloro-phenyl)-ethyl]-3,4,9,10-perylene dicarboximide (2,4ClPEPTC), N,N'-dioctyl-3,4,9,10-perylenedicarboximide (PTCDI-C8), and Diindeno[1,2,3-cd;1',2',3'-lm]perylene (DIP).

N-type polymer organic semiconductors can include, but are not limited to: (benzimidazobenzophenanthroline); poly(2,5-di(3,7-dimethyloctyloxy)cyanoterephthalylidene); poly(5-(3,7-dimethyloctyloxy)-2-methoxy-cyanoterephthalylidene); and poly{[N,N'-bis(2-octyldodecyl)-naphthalene-1,4,5,8-bis(dicarboximide)-2,6-diyl]-alt-5,5'-(2,2'-bithiophene)} (P(NDI2OD-T2).

Ambipolar charge-transporting organic semiconductors can include, but are not limited to: 9-(1,3-dithiol-2-ylidene)thioxanthene-C60 diad; oligothio-phene/fullerene triad (2:16T-2C60); poly(3,9-di-tert-butylindeno[1,2-b]fluorene) (PIF); and swallow-tailed quaterrylene tetracarboxdiimide (SWQDI). Materials discussed in previous sections under p-type or n-type categories may be utilized as ambipolar charge transport materials in certain conditions where efficient injection of both holes and electrons can be achieved.

In the ambipolar vertical field effect transistor, a Schottky barrier may form between the drain layer and the semiconducting channel layer preventing both hole and electron injection from the drain layer into the channel layer. The gate layer may be formed on a substrate. The drain layer may be formed on a substrate. The semiconducting channel layer may comprise a phase separated structure including a plurality of carrier pathways extending between the source layer and the drain layer, each pathway comprising a p-channel organic semiconductor or an n-channel organic semiconductor.

An inverter may comprise two back-to-back connected ambipolar vertical field effect transistors. The two ambipolar vertical field effect transistors may comprise a non-injecting drain layer for both hole and electron injection into the semiconducting channel layer. A first of the two ambipolar vertical field effect transistors may comprise a non-injecting drain layer for hole injection into the semiconducting channel layer and a second of the two ambipolar vertical field effect transistors may comprise a non-injecting drain layer for electron injection into the semiconducting channel layer. The two ambipolar vertical field effect transistors may comprise active areas of different size to compensate for a mobility difference of the holes and electrons. The gate layer and the dielectric layer may be common to the two ambipolar vertical field effect transistors. The semiconducting layer may be common to the two ambipolar vertical field effect transistors. The two ambipolar vertical field effect transistors may include separate semiconducting layers. The drain layer may be common to the two ambipolar vertical field effect transistors. The dielectric surface treatment layer may be common to the two ambipolar vertical field effect transistors.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. An ambipolar vertical field effect transistor, comprising:
   a gate layer;
   a source layer that is electrically percolating and perforated;
   a dielectric layer disposed between the gate layer and the source layer;
   a drain layer; and
   a semiconducting channel layer disposed between the source layer and the drain layer, wherein the semiconducting channel layer is in contact with at least a portion of the source layer and at least a portion of the dielectric layer and includes at least one first domain having at least one crystal grain of p-type semiconductor material and at least one second domain having at least one crystal grain of n-type semiconductor material, and wherein the at least one first domain and the at least one second domain form carrier mobility channels that extend between the source layer and the drain layer.

2. An ambipolar vertical field effect transistor, comprising:
   a gate layer;
   a dielectric surface treatment layer;
   a dielectric layer disposed between the gate layer and the dielectric surface treatment layer;
   a source layer that is electrically percolating and perforated, where the dielectric surface treatment layer is disposed between the source layer and the dielectric layer;
   a drain layer; and
   a semiconducting channel layer disposed between the source layer and the drain layer, wherein the semiconducting channel layer is:
      in contact with at least a portion of the source layer and at least a portion of the dielectric surface treatment layer,
      includes at least one first domain of p-type semiconductor material having a HOMO level within 2 eV below a Fermi level of the source layer, and
      includes at least one second domain of n-type semiconductor material having a LUMO level within 2 eV above the Fermi level of the source layer.

3. The ambipolar vertical field effect transistor of claim 1, wherein the at least one first domain and the at least one second domain have single crystal grains that extend through the semiconducting channel layer and contact both the source layer and the drain layer to form the carrier mobility channels within the semiconducting channel layer.

4. The ambipolar vertical field effect transistor of claim 1, wherein the at least one first domain and the at least one second domain have crystal grains that interconnect with other crystal grains to form the carrier mobility channels that extend through the semiconducting channel layer and connect the source layer and the drain layer.

5. The ambipolar vertical field effect transistor of claim 3, wherein semiconducting channel layer has a channel length that is a dimension of a single crystal grain.

6. The ambipolar vertical field effect transistor of claim 3, wherein the semiconducting channel layer has a dimension of a single crystal grain.

7. The ambipolar vertical field effect transistor of claim 3, wherein the semiconducting channel layer comprises an amorphous material that alters the morphology of the semiconducting channel layer.

8. The ambipolar vertical field effect transistor of claim 2, wherein the p-type semiconductor material is a p-type organic semiconductor and the n-type semiconductor material is a n-type organic semiconductor.

9. The ambipolar vertical field effect transistor of claim 8, wherein the semiconducting channel layer comprises a phase separated structure with the p-type organic semiconductor and the n-type organic semiconductor forming discrete domains.

10. The ambipolar vertical field effect transistor of claim 9, wherein the discrete domains of p-type organic semiconductor form high mobility pathways for hole transport between the source layer and the drain layer.

11. The ambipolar vertical field effect transistor of claim 9, wherein the discrete domains of n-type organic semiconductor form high mobility pathways for electron transport between the source layer and the drain layer.

12. The ambipolar vertical field effect transistor of claim 1, wherein the p-type semiconductor material of the at least one first domain possesses a HOMO level able to accept hole injection from the source layer, and the n-type semiconductor material of the at least one second domain possesses a LUMO level able to accept electron injection from the source layer.

13. The ambipolar vertical field effect transistor of claim 12, wherein a Schottky barrier forms between the drain layer and the semiconducting channel layer preventing hole injection between the drain layer and the p-type semiconductor material of the at least one first domain and electron injection between drain layer and the n-type semiconductor material of the at least one second domain.

14. The ambipolar vertical field effect transistor of claim 1, wherein the semiconducting channel layer comprises inorganic semiconducting materials that are processed from solution.

15. The ambipolar vertical field effect transistor of claim 1, wherein the semiconducting channel layer comprises semiconducting materials that are formed through a sol-gel process.

16. The ambipolar vertical field effect transistor of claim 1, wherein the semiconducting channel layer comprises a phase separated structure including the at least one first domain and the at least one second domain.

17. An inverter comprising:
two back-to-back connected ambipolar vertical field effect transistors, wherein a first ambipolar vertical field effect transistor of the two back-to-back connected ambipolar vertical field effect transistors comprises:
a gate layer;
a source layer that is electrically percolating and perforated;
a dielectric layer disposed between the gate layer and the source layer;
a drain layer; and
a semiconducting channel layer disposed between the source layer and the drain layer, where the semiconducting channel layer is in contact with at least a portion of the source layer and at least a portion of the dielectric layer, and includes at least one p-type semiconductor domain and at least one n-type semiconductor domain, and wherein the drain layer forms a hole injection barrier for the at least one p-type semiconductor domain and an electron injection barrier for the at least one n-type semiconductor domain.

18. The inverter of claim 17, wherein a second of the two ambipolar vertical field effect transistors comprises a non-injecting drain layer for hole injection into the semiconducting channel layer.

19. The inverter of claim 17, wherein a second of the two ambipolar vertical field effect transistors comprises a non-injecting drain layer for electron injection into the semiconducting channel layer.

20. The inverter of claim 17, wherein the two ambipolar vertical field effect transistors comprise active areas of different size to compensate for a mobility difference of the holes and electrons.

21. The inverter of claim 17, wherein the gate layer and the dielectric layer are common to the two ambipolar vertical field effect transistors.

22. The inverter of claim 21, wherein the semiconducting channel layer of the first ambipolar vertical field effect transistor is common to the two ambipolar vertical field effect transistors.

23. The inverter of claim 21, wherein a second of the two ambipolar vertical field effect transistors has a second semiconducting channel layer separate from the semiconducting channel layer of the first ambipolar vertical field effect transistor.

24. The inverter of claim 21, wherein the drain layer is common to the two ambipolar vertical field effect transistors, and wherein the drain layer is positioned over the semiconducting channel layer.

25. The inverter of claim 21, wherein the dielectric layer is common to the two ambipolar vertical field effect transistors.

* * * * *

UNITED STATES PATENT AND TRADEMARK OFFICE
CERTIFICATE OF CORRECTION

PATENT NO. : 9,601,707 B2
APPLICATION NO. : 14/648608
DATED : March 21, 2017
INVENTOR(S) : Andrew Gabriel Rinzler et al.

Page 1 of 1

It is certified that error appears in the above-identified patent and that said Letters Patent is hereby corrected as shown below:

In the Claims

Please replace Column 19, Line 41, with the following corrected version:
-- tion between the drain layer and the n-type semiconductor --

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*